(12) United States Patent
Ellison et al.

(10) Patent No.: US 9,804,494 B2
(45) Date of Patent: Oct. 31, 2017

(54) METHOD FOR CREATING TOPOGRAPHICAL PATTERNS IN POLYMERS VIA SURFACE ENERGY PATTERNED FILMS AND THE MARANGONI EFFECT

(71) Applicant: Board of Regents of the University of Texas System, Austin, TX (US)

(72) Inventors: Christopher J. Ellison, Austin, TX (US); Joshua M. Katzenstein, Austin, TX (US); Dustin W. Janes, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 1007 days.

(21) Appl. No.: 13/967,814

(22) Filed: Aug. 15, 2013

(65) Prior Publication Data

US 2014/0054822 A1  Feb. 27, 2014

Related U.S. Application Data

(60) Provisional application No. 61/692,088, filed on Aug. 22, 2012.

(51) Int. Cl.
*B29C 59/02* (2006.01)
*G03F 7/26* (2006.01)

(52) U.S. Cl.
CPC ............. *G03F 7/26* (2013.01); *B29C 59/02* (2013.01); *Y10T 428/24802* (2015.01)

(58) Field of Classification Search
CPC .................................................... B29C 59/16

USPC ........................................ 264/293, 446, 405
See application file for complete search history.

(56) References Cited

U.S. PATENT DOCUMENTS

| | | | |
|---|---|---|---|
| 2002/0142229 A1 | 10/2002 | Resnick et al. | |
| 2003/0087073 A1* | 5/2003 | Kobayashi | B82Y 30/00 428/209 |
| 2011/0294243 A1 | 12/2011 | Jeon et al. | |

FOREIGN PATENT DOCUMENTS

| KR | 2003-0006784 A | 1/2003 |
|---|---|---|
| KR | 100643684 B1 | 11/2006 |

OTHER PUBLICATIONS

Shaffer, Instabilities in thin polymer films: Structure formation and pattern transfer. Univ Konstanz, pp. III-IV, 1-8, 95-98, Figures 7.1, 7.2, 2001.
International Search report and written opinion for PCT/US2013/055098 dated Dec. 17, 2013.

\* cited by examiner

*Primary Examiner* — Christina Johnson
*Assistant Examiner* — Xue Liu
(74) *Attorney, Agent, or Firm* — Meunier Carlin & Curfman LLC

(57) ABSTRACT

Using a broadband light source and a photomask, surface energy gradients can be directly transferred into polymer films. The Marangoni effect causes high surface energy regions to rise upon heating the film. This leads to the formation of three-dimensional topography that can be locked in by quenching the polymer by cooling.

20 Claims, 31 Drawing Sheets

METHOD FOR CREATING TOPOGRAPHICAL PATTERNS IN POLYMERS VIA SURFACE ENERGY PATTERNED FILMS AND THE MARANGONI EFFECT

PRIORITY CLAIM

This application claims the benefit of U.S. Provisional Application No. 61/692,088 filed on Aug. 22, 2012.

STATEMENT REGARDING FEDERALLY SPONSORED RESEARCH OR DEVELOPMENT

This invention was made with government support under Grant number DMR-1053293 awarded by the National Science Foundation (NSF). The government has certain rights to this in the invention.

BACKGROUND OF THE INVENTION

1. Field of the Invention

The invention generally relates to patterning of polymeric materials. More specifically, the invention relates to light based patterning methods.

2. Description of the Relevant Art

Optical lithography techniques are currently used to alter topographies of many different surfaces. For example, submicron scale lithography has been a critical process in the microelectronics industry. Other applications of nanometer scale lithography exist in the areas of opto-electronics and magnetic storage. For example, photonic crystals and high-density patterned magnetic memory of the order of terabytes per square inch may require sub-100 nanometer scale lithography.

For making sub-50 nm structures, optical lithography techniques may require the use of very short wavelengths of light (e.g., about 13.2 nm). Such processes lead to extremely complicated equipment and techniques that may be prohibitively expensive. It is also believed that high-resolution e-beam lithography techniques, though very precise, are too slow for high volume commercial applications.

Several imprint lithography techniques have been investigated as low cost, high volume manufacturing alternatives to conventional photolithography for high-resolution patterning. Imprint lithography techniques are similar in that they use a template containing topography to replicate a surface relief in a film on the substrate.

Techniques such as electrohydrodynamic patterning (EHP) of polymers and photopolymerizable liquids, lithographically induced self-assembly (LISA), and lithographically induced self-construction (LISC), have previously been used to create topographic features in polymer films. These techniques are driven by physical forces created when a mask is placed in close proximity to the polymer during thermal processing of the polymer. The requirement of a mask during this step, inherently limits the throughput of these techniques.

It is desirable to develop alternative techniques to photolithography and imprint lithographic techniques that are low cost and capable of being used in high throughput applications.

SUMMARY OF THE INVENTION

In an embodiment, a method of forming a pattern in a polymer substrate includes: exposing the solid polymer substrate to a pattern of activating light for a time sufficient to cause at least a portion of the polymer substrate to undergo a chemical change in the solid state; and heating the polymer substrate to a temperature sufficient to liquify the polymer substrate after exposure to activating light, wherein the temperature is selected such that the polymer substrate adopts a configuration that corresponds to the pattern of activating light. In some embodiments, the polymer substrate is a thin film deposited on a substrate. The polymer substrate, in some embodiments, includes a mixture of a polymer and one or more photosensitizers. Alternatively, or in addition, the polymer substrate includes a polymer coupled to one or more photosensitizers. After the polymer substrate has been heated the polymer may be solidified by cooling the polymer substrate. In an alternate embodiment, the polymer may be solidified by crosslinking the polymer.

The pattern of activating light may be formed by shining the activating light through a mask that is proximate to the polymer substrate. The mask may be removed from the proximity of the substrate prior to heating the polymer substrate. In some embodiments, a liquid layer is formed on the surface of the polymer substrate prior to exposing the polymer substrate to a pattern of activating light. The liquid layer may be removed from the surface after the polymer substrate is exposed to a pattern of activating light. Alternatively, the liquid layer remains on the surface when the polymer substrate is heated to liquify the polymer substrate. In an alternate embodiment, a metal layer or other inorganic or vapor deposited compounds are deposited on the surface of the polymer substrate prior to exposing the polymer substrate to a pattern of activating light. Alternatively, or additionally, a metal layer or other inorganic or vapor deposited compounds are deposited on the surface of the activating light exposed polymer substrate prior to heating the polymer substrate to liquify the polymer substrate.

In some embodiments, a second polymeric layer is deposited on the surface of the polymer substrate prior to exposing the polymer substrate to a pattern of activating light. In some embodiments the method includes heating the cooled polymer substrate to liquify the polymer at a temperature and time sufficient to remove at least a portion of the topographic features formed in the cooled polymer substrate.

In an embodiment, the method of forming a pattern in a polymer substrate may be used to form a lithographic template. The resulting lithographic template may be used to transfer a pattern from the template to a substrate.

BRIEF DESCRIPTION OF THE DRAWINGS

Advantages of the present invention will become apparent to those skilled in the art with the benefit of the following detailed description of embodiments and upon reference to the accompanying drawings in which.

Figure 1A:
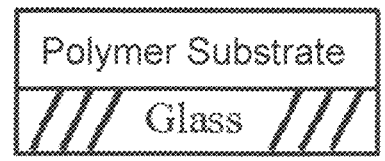
FIGS. 1A-1C depicts a schematic diagram of processing steps for the formation of features in a polymeric film.

While the invention may be susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF THE PREFERRED EMBODIMENTS

It is to be understood the present invention is not limited to particular devices or methods, which may, of course, vary. It is also to be understood that the terminology used herein is for the purpose of describing particular embodiments only, and is not intended to be limiting. As used in this specification and the appended claims, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

Small variations in temperature or composition at a fluid interface, often spontaneously generated, can cause local changes in surface tension and promote dramatic movement of the fluid. This phenomenon, referred to as the Marangoni Effect, is familiar to most people in the "tears" or "legs" in a glass of wine. The effect describes a wide variety of phenomena, from thickening of a tear film lipid layer in the human eye to 'fingering instabilities' in spreading thin films. It can also be used to manipulate the motion and position of fluids and to influence the surface roughness of spin coated films. Here we show that the Marangoni-driven flow of a liquid polymer can be harnessed to produce a diversity of topographic structures that can be preserved by quenching the liquid polymer to a solid. We describe a new procedure in which surface energy gradients are created by patterning an amorphous, solid polymer film using a broadband light source and photomasks. To enable the Marangoni flow, the polymer is then heated to a liquid state and three-dimensional features are rapidly generated and later preserved by subsequently quenching the film to a solid state below either a glass transition temperature ($T_g$) or melt transition temperature ($T_m$). These topographical structures are potentially useful for a variety of applications, such as the facile creation of soft lithography stamps like those used for transistor arrays, and fabrication of templates for guidance of neurite growth. Additionally, this procedure could be used to create textured surfaces useful for engineered anti-fouling materials. Given that a short light exposure time, as little as 10 seconds, is sufficient, this approach could also be used to create surface topography in high speed roll-to-roll processes over large areas.

The driving force for topography in this work is fundamentally different than other processes. The Marangoni-driven flow demonstrated here originates from surface energy gradients caused by photochemical processes which occur rapidly in the polymer upon exposure to light. The topography is then developed thermally in the absence of a mask.

In one embodiment, a method of forming a pattern in a polymer substrate includes exposing the solid polymer substrate to a pattern of activating light for a time sufficient to causes at least a portion of the polymer substrate to undergo a chemical change; heating the polymer substrate to a liquid state, above the $T_m$ or $T_g$ of the polymer substrate, after exposure to activating light, wherein the polymer substrate adopts a configuration that corresponds to the pattern of activating light; and cooling the polymer substrate to the solid state, below the $T_g$ or $T_m$ of the polymer.

As used herein "activating light" means light that may affect a chemical change. Activating light may include ultraviolet light (e.g., light having a wavelength between about 150 nm to about 400 nm), actinic light, visible light or infrared light. Generally, any wavelength of light capable of affecting a chemical change may be classified as activating. Chemical changes may be manifested in a number of forms. A chemical change may include, but is not limited to, any chemical reaction that causes a change in a functional group or a backbone substituent of a polymer. This chemical change typically results in a change in surface energy of the polymer substrate.

In an embodiment, the polymer substrate is a thin film deposited on a substrate. A mask is positioned in a position proximate to the solid polymeric film and activating light is directed through the mask. The activating light induces one or more chemical changes in the polymeric film. The mask is removed from the proximity of the substrate prior to heating the polymer substrate to a liquid. The chemical changes induced by the activating light, cause the heated polymer to adopt a configuration that corresponds to the pattern of activating light.

In some embodiments, the patterned polymeric substrate may be used as an imprint lithographic template. The imprint lithographic template may be used to form a pattern on a substrate. Imprint lithographic templates formed from this process could also be used for high speed patterning in roll-to-roll processing for the manufacturing of micro/nano textured surfaces. Micro/nano textured surfaces are useful for antibiofouling applications, soft-lithographic stamps, and microfluidic devices.

The ability to develop topography in the absence of a mask means that the chemical pattern can be transferred into the polymer film and the topographic pattern separately developed at a later time. Additionally, given the short light exposure time, as little as 10 seconds in some instances, and the ability to develop features over large surface areas, this approach can be used to create a surface topography in high speed roll-to-roll processes. Furthermore, the process does not require wet- or dry-etch development process to reveal the surface topography.

This process may also be used for the creation of engineering anti-biofouling applications. These applications use textured surfaces in order to prohibit attachment of mollusks and other sea creatures that create significant drag on the hull of a ship. The process described herein could help facilitate the creation of materials over a large area that could be applied to ships from rolls.

Figure 1B:
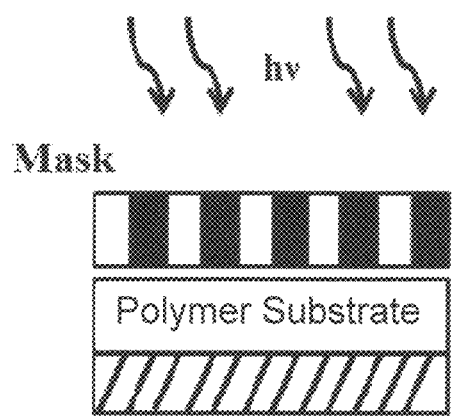
Figure 1C:
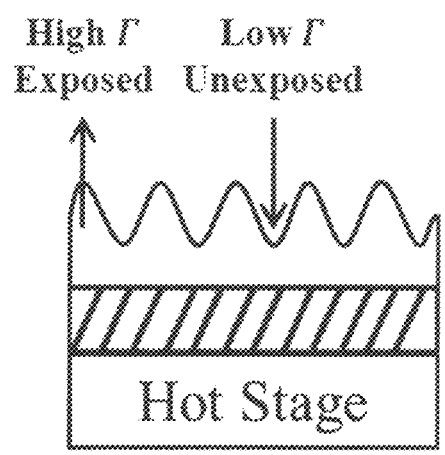

The formation of surface topography by Marangoni-driven flow on a spin coated polymer film substrate includes three basic steps (FIG. 1). First, a polymer substrate, for example polystyrene (PS), is deposited onto a substrate (FIG. 1A). The polymer substrate is then exposed to light through a photomask for predetermined amount of time (FIG. 1B). Finally, the polymer film substrate is heated to a liquid state above the $T_g$ or $T_m$ of the polymer substrate to reduce its viscosity and facilitate flow (FIG. 1C). During this time the surface energy ($\Gamma$) gradient imposed by chemical changes to the polymer substrate caused by patterned photoexposure causes flow of material from unexposed (low surface energy) areas to exposed (high surface energy) areas, resulting in surface topography in a prescribed pattern dictated by the mask.

Figure 2A:
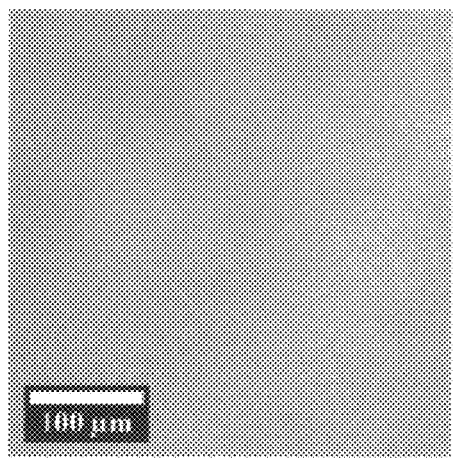
FIGS. 2A-C depict corresponding bright field micrograph images of the steps of feature formation illustrated in FIGS. 1A-1C.
Figure 2B:
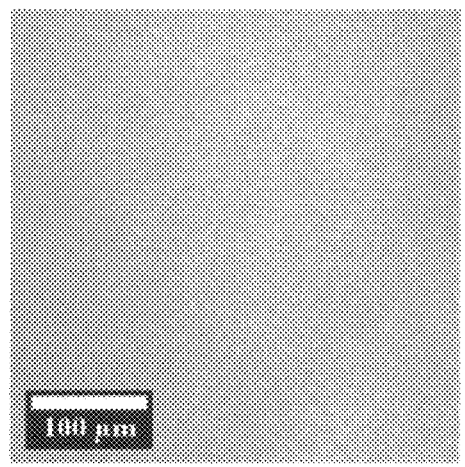
Figure 2C:
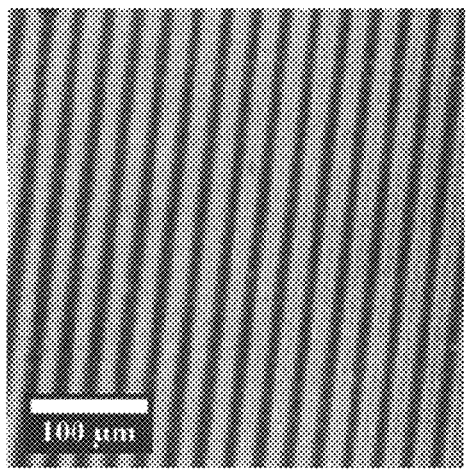

FIGS. 1A-C depict a schematic illustration of the steps involved in feature formation in a polymer thin film. FIGS. 2A-C depict corresponding bright field micrograph images of the steps of feature formation. In the example of FIGS. 2A-C, a ~150 nm thick PS film is spin coated onto a clean glass microscope slide, FIG. 2A. The solid state polymer film is exposed to a broadband light source through a photomask inducing a surface energy pattern (higher surface energy in the exposed regions). No topography can be detected on the film by bright field microscopy and atomic force microscopy (AFM) after this stage (FIG. 2B). The film is heated to 110° C. where the polymer becomes a liquid causing the formation of topographic features via Marangoni driven flow (FIG. 2C).

Figure 3A:
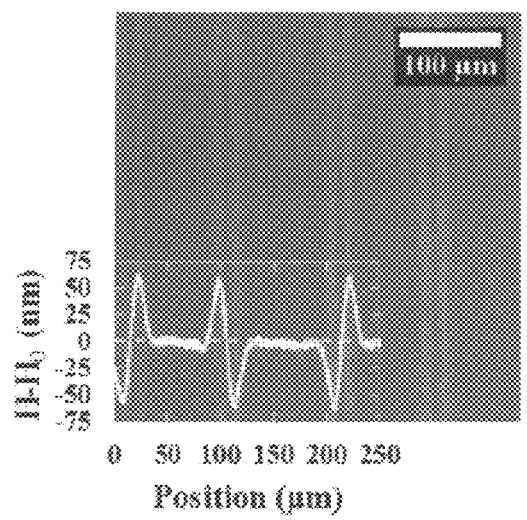
FIGS. 3A-3C depict various line pattern periods created using photo masks of different IS line spacing with overlaid profilometry traces.
Figure 3B:
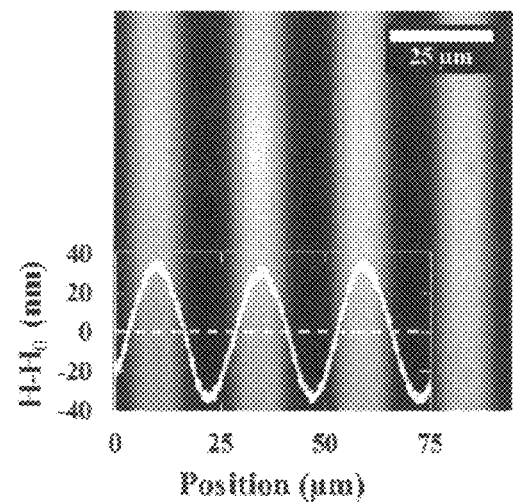
Figure 3C:
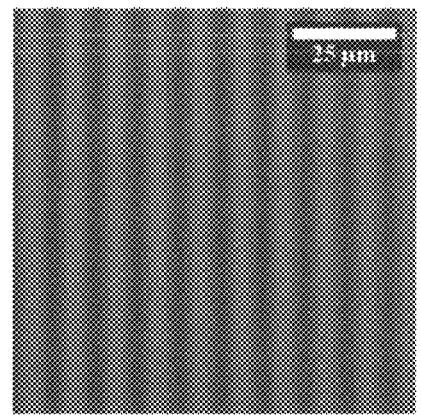

Photomasks with a regular array of lines and spaces with different periods were examined to demonstrate this effect. Various line pattern periods created using photo masks of different line spacing with overlaid profilometry traces showing topography of 100 µm chrome lines with a 200 µm pitch (FIG. 3A); 12.5 µm chrome lines on a 25 µm pitch (FIG. 3B); and 5 µm chrome lines on a 10 µm pitch (FIG. 3C). For the pattern of FIG. 3C, the profilometer stylus is too large for accurate characterization of the topography for features this size. FIG. 3A also shows that Marangoni-driven patterning is sensitive to the local gradient in surface energy, which occurs only near interfaces of exposed and unexposed regions that are a smaller portion of the overall image in FIG. 3A compared to the masks of FIG. 3B or 3C. All films are roughly 150 nm thick before patterning.

Figure 4A:
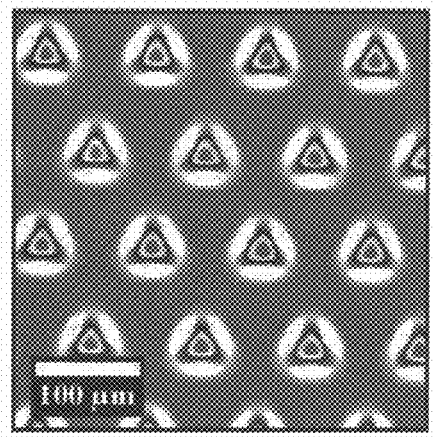
FIGS. 4A-4F depicts bright field micrograph images of various patterns formed using the feature transfer methods described herein.
Figure 4B:
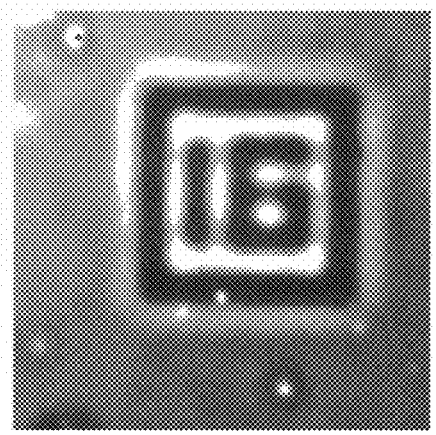
Figure 4C:
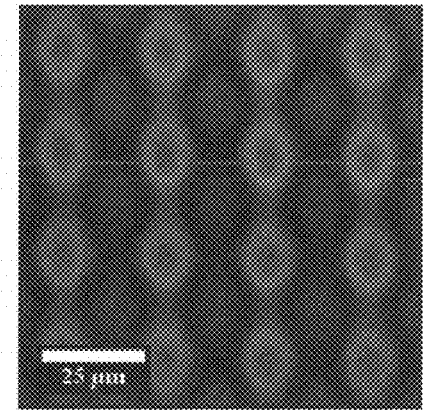
Figure 4D:
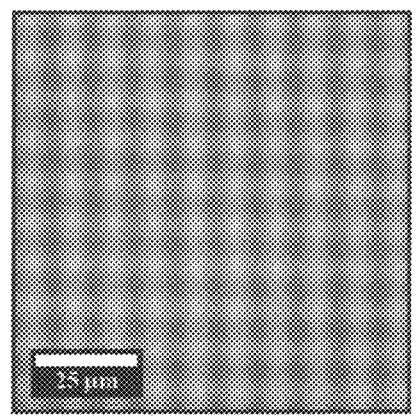
Figure 4E:
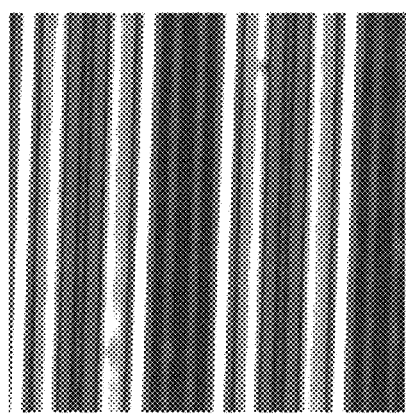
Figure 4F:
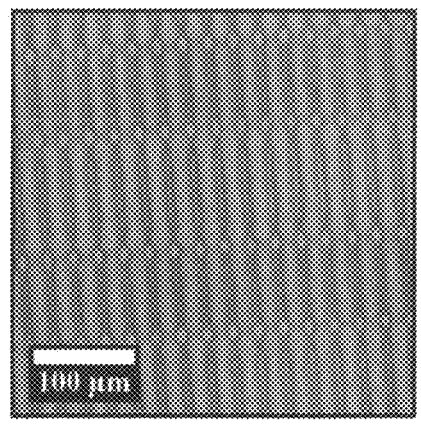
Figure 25A:
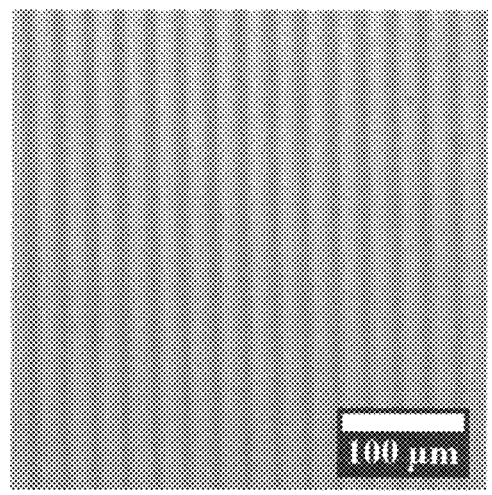
FIGS. 25A-B depict micrographs of a process of transferring a pattern from a polystyrene film to a lithographic template.

The periodicity of features formed matches that of the photomask, while the topography of the features exhibits curvature not present in the mask itself. These features appear similar to those formed through buckling instabilities in polymer thin films, but are formed by an entirely different mechanism. Additionally, these features appear over an area as large as the output of S the light source, which in principle is scalable to high throughput methods such as roll-to-roll processing. The topographical features generated in this work can be transferred into typical soft lithography mask materials like Sylgard 184 (see FIGS. 25A & 25B; 25A is a patterned polymer substrate while 25B is a Sylgard replica), which offers an additional avenue to pattern replication. Formation of surface topography through the Marangoni effect is not limited to lines and spaces; it can be applied to any arbitrary design as long as a suitable photomask for UV light is available. In this way it is possible to transfer more complex patterns such as triangles (FIG. 4A) or numbers (FIG. 4B). Patterns shown in FIG. 4A (triagonal pillars) and FIG. 4B (numbers) are both 1:1 replications of patterns from a photomask. In these images, the triaganol features rise up above the film (exposed to light) while the numbers are depressed in the film (unexposed to light). Additionally, multiple exposures with either the same (FIG. 4C-D) or different, (FIG. 4E-F) masks of lines and spaces can be used to create more complex patterns. Patterns shown in FIG. 4C (large posts) and FIG. 4D (small posts) are formed by exposure through the same line-and-space mask twice with the mask turned 90° between exposures. The pattern shown in FIG. 4E lines-in-lines is the result of two exposures of different line-and-space periods parallel to each other. The pattern shown in FIG. 4F, 'dogbones', is formed by the same method with the second mask turned 90° between exposures. Colors are interference patterns caused by changes in film height. All films are roughly 150 nm thick before patterning.

Figure 5A:
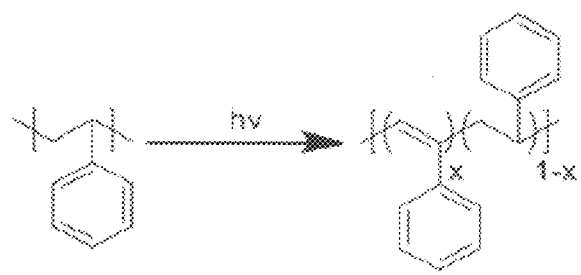
FIG. 5A depicts a schematic of polymer photochemistry during UV photoexposure.
Figure 5B:
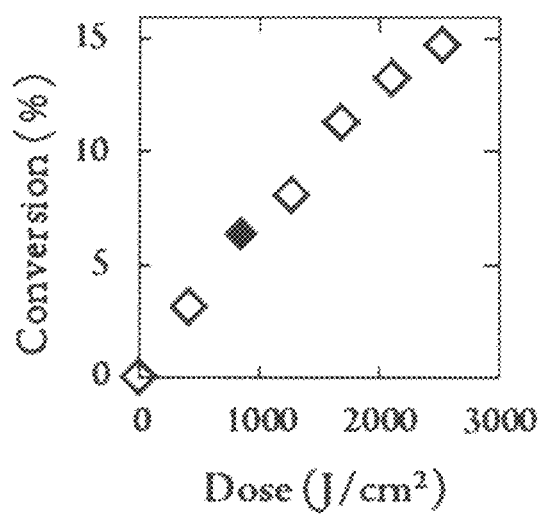
FIG. 5B depicts percent conversion of PS backbone to carbon-carbon double bonds as a function of exposure dose.

Previous research has shown that exposing PS to UV light dehydrogenates the carbon-carbon bonds in the backbone of the polymer chain resulting in double bond formation. FIG. 5A depicts a schematic of polymer photochemistry during UV photoexposure. These double bonds create 'stilbene-like' chemical structures (FIG. 5A) from some of the repeat units which have significantly red shifted fluorescence characteristics compared to neat PS. FIG. 5B depicts percent conversion of PS backbone to carbon-carbon double bonds as a function of exposure dose by FTIR spectroscopy based on the decrease in the area of the peak corresponding to alkane bonds in the backbone (2800-2964 $cm^{-1}$) compared to the area of under the peak at 1720 $cm^{-1}$, corresponding to the carbonyl present in the polymerization initiator, a constant. See FIGS. 6A and 6B for full FTIR spectra as a function of exposure dose. Solution fluorimetery can be used to qualitatively detect the creation of new stilbene-like fluorescence centers (See FIG. 7). Furthermore, Marangoni driven patterning can be suppressed when the UV wavelengths of light absorbed by polystyrene are filtered out from the light source by a long pass filter (see FIG. 8), indicating that UV photochemistry of PS is responsible for topography formation in this process.

Figure 26:
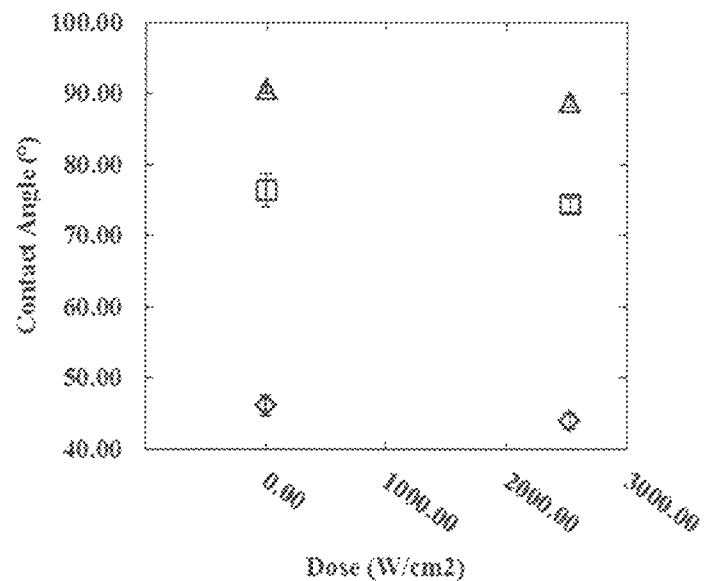
FIG. 26 depicts a graph of contact angle of polystyrene as a function of exposure dose.

The change in surface chemistry is qualitatively detectable by measuring a test liquid contact angle on the polystyrene film surface. Contact angle of polystyrene as a function of exposure dose for water (triangles), glycerol (squares), and poly(ethylene glycol) (diamonds) is shown in FIG. 26. Error bars indicate standard deviation from ten measurements. Changes are all statistically significant ($p<0.001$).

In order for topography to form via the Marangoni effect, the photochemistry must result in exposed regions with different surface energy compared to the original polymer. Generally, polymers with pure alkane backbones have lower surface energies than analogous polymers with alkene bonds in their backbones. In the simplest examples, poly(butadiene), a polymer with an alkene containing backbone, and poly(acetylene), consisting of a completely conjugated alkene backbone, have higher surface energies than polyethylene, which has a backbone made up of only alkane bonds. By using a photomask, the conversion of polymer to a partially dehydrogenated form by UV photochemistry occurs only within exposed regions of a film creating a pattern of relatively high and low surface energy regions from what was originally a chemically homogeneous film. Since the polymer is a solid at room temperature, it cannot flow until the polymer transitions to a liquid upon heating, however the surface energy pattern was established previously in the solid state.

To overcome the viscous forces that retard flow, a minimum critical gradient in surface energy is necessary. This value is characterized by the dimensionless Marangoni number defined as in Equation (1).

$$Ma = -\frac{\Gamma H^2 \nabla C_{PS}}{\mu D} \quad (1)$$

In this equation, Ma is the Marangoni number, $\Gamma$ is the surface energy change with composition, $C_{PS}$ is the concentration of PS in the plane of the film, H is the characteristic length of the surface energy gradient, in this case the half pitch of the photomask being used, $\mu$ is the viscosity, and D is the diffusion coefficient. Previous studies established that the minimum critical Marangoni number for Marangoni driven instabilities is 80. From this criterion the conversion of polymer necessary to reach this minimum threshold can be estimated using a group contribution method to provide a rough estimate of the surface energy of the constituent polymers. For example, in a polystyrene and poly(phenyl acetylene) system, only 0.02% of backbone alkane bonds would need to undergo dehydrogenation to reach a Marangoni number of 80 for the smallest line and space pattern photomask (see Experimental Section).

Using FTIR (Fourier transform infrared spectroscopy, see FIGS. 6A and 6B for full spectra), dehydrogenation of the polymer backbone can be determined as a function of the exposure dose. For example, in polystyrene, as the alkane bonds in the backbone are converted to alkenes, the peak from 2800-2964 $cm^{-1}$ corresponding to methylene C—H bond stretching decreases. By comparing this to the peak corresponding to the carbonyl in the initiator used for polymerization (1720 $cm^{-1}$), which is unaffected by UV exposure, the dehydrogenation of the polystyrene backbone can be quantified. FIG. 5B shows the percent conversion of a polystyrene backbone to its dehydrogenated form at different exposure doses. From this analysis the exposure dose for this experiment (840 $J/cm^2$) yields a conversion of 6.4%, well above the estimated threshold needed to induce Marangoni-driven flow. Under the exposure conditions used in this study, no surface oxidation was detectable by X-ray photoelectron spectroscopy (see FIG. 9), nor were cross-linking or molecular weight distribution changes observed by gel permeation chromatography (see FIG. 10). Therefore, changes in surface energy arising from photoexposure are attributed solely to dehydrogenation of the polystyrene backbone. Additional experiments were performed to ensure that the mask was not causing indentations in the polymer film and that topography was due only to Marangoni flow (see FIG. 11).

Figure 27:
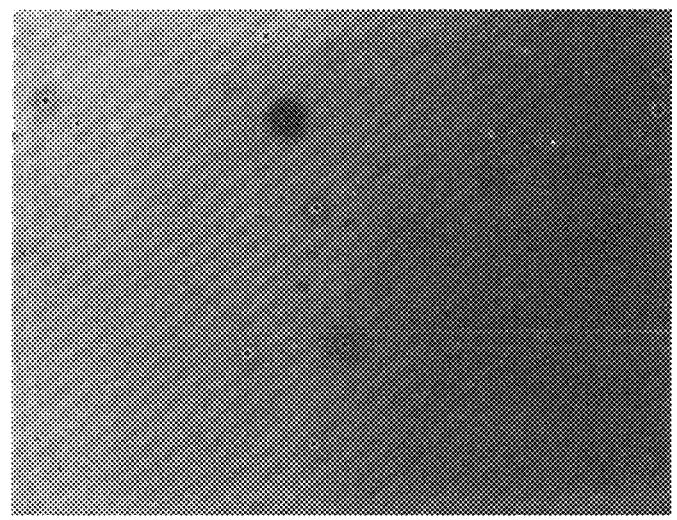
FIG. 27 depicts a micrograph of a high molecular weight polystyrene film exposed to light.

Low molecular weight polymers have two advantages in Marangoni-driven topography formation. First, the Rouse model predicts that the Marangoni number for polymer melts is independent of molecular weight, M, in unentangled polymers (i.e., D scales as $1/\mu$). Interestingly for entangled polymers, the Marangoni number decreases with increasing molecular weight, $Ma \sim M^{-1.1}$ (e.g., $\mu D \sim M^{1.1}$). Therefore for Marangoni-driven flow of polymers with higher M, more common in commercial applications, require higher degrees of dehydrogenation. Second, the viscosity of most polymers at a given temperature decreases with decreasing molecular weight; therefore the topography develops more quickly with a low molecular weight polymer. However, topographical patterns have been made from several different molecular weights (e.g., 2900 g/mol in FIGS. 3 and 4 and 8000 g/mol in FIG. 27). The critical Marangoni number criterion only determines whether or not surface instabilities will occur, but does not address the kinetics of feature formation. Therefore, to develop the pattern in the shortest time, a low viscosity polymer is preferable. However, any polymer architecture could be suitable including block, random, linear, branched, star, dendrimer or others. Given the photochemical conversion we observe, sub-micron features may be formed using photochemical Marangoni patterning.

Experimental Section

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

Materials and Materials Characterization

Chemicals used in this study were purchased from Fisher Scientific or Sigma Aldrich and all chemicals were used as received unless otherwise noted. Anisole and styrene were purified by stirring with basic alumina and calcium hydride for two hours and then filtered to remove solids. Tris(2-dimethylamino-ethyl)amine, Me$_6$TREN, was synthesized according to a published procedure. Molecular weight and polydispersity data were measured using a Viscotek GPC-Max VE 2001 Gel Permeation Chromatography (GPC) Solvent/Sample module with a Viscotek Model 270 Dual Detector Viscometer/Light Scattering detector, Viscotek VE 3580 Refractive Index Detector with 2 I-Series Mixed Bed Low MW Columns using tetrahydrofuran (THF) as an eluent at 1 mL/min. Polymers were absolutely characterized by Viscotek Triple Detect software combining light scattering, refractive index detection and viscometry. Nuclear Magnetic Resonance (NMR) spectra were recorded on a Varian 400 MHz DirectDrive NMR with SMS sample changer. The glass transition temperature ($T_g$) of the bulk polymer samples were measured by differential scanning calorimetry (DSC) using a Mettler-Toledo DSC-I with a 10° C./min heating rate upon second heating. UV/V is measurements were performed on a Thermo Scientific Evolution 220 UV-Visible Spectrophotometer.

The polymerization technique used to synthesize materials for this study was activators regenerated by electron transfer atom transfer radical polymerization (ARGET ATRP). Polystyrene (PS) (Mn=2900, polydispersity index (PDI)=1.2) was synthesized by dissolving an initiator (ethyl 2-bromoisobutyrate) and styrene in anisole. Copper(II) bromide was used as a catalyst and a ligand (Me$_6$TREN) was incorporated to aid in copper solubility. After the reactor was sealed and sparged with dry argon for 15 minutes, the reducing agent, tin(II) 2-ethylhexanoate, was injected and the reaction was allowed to proceed for 24 hours at 90° C. The resulting polymer was diluted with THF and run through basic alumina to remove the copper and ligand, dried under vacuum above the $T_g$ (61.3° C. midpoint by DSC) of the polymer to remove residual solvents and then freeze dried from benzene.

For fluorescence microscopy experiments, a nitrobenzofurazan (NBD) fluorophore was covalently attached to the polystyrene using established literature procedures (Scheme 1) for CuI-catalyzed azide/alkyne cycloaddition "click chemistry". The alkyne functionalized fluorophore was prepared by dissolving 4-chloro-7-nitro-2, 1,3-benzoxadiazole (NBD-Cl) in ethanol in the presence of pyridine and adding propargylamine (3-amino-1-propyne) drop-wise and stirring for two hours at room temperature. The solvent was removed under vacuum and the resulting solid was purified by column chromatography (30% Ethyl acetate/petroleum spirits) to give 7-nitro-N-(prop-2-ynyl)-2,1,3-benzoxadiazol-4-amine (NBD-Aminyne) in 54% yield, purity was verified by NMR.

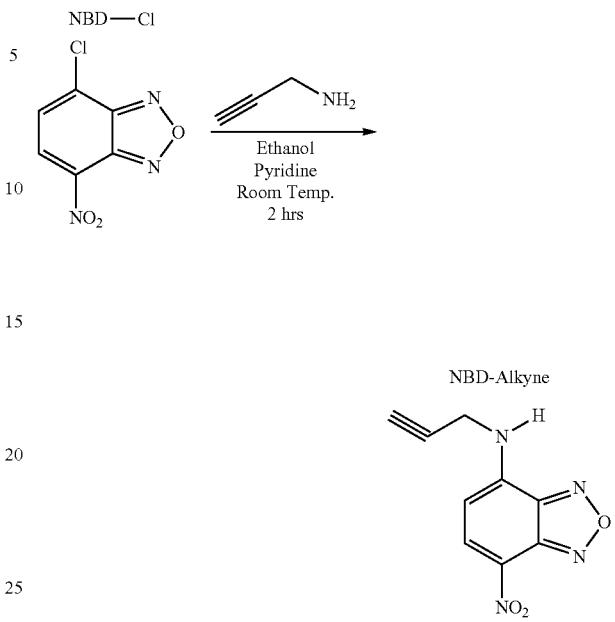

SCHEME 1

The azide-terminated polystyrene (Scheme 2) was prepared by dissolving the polymer in N,N'-dimethylformamide (DMF) with a three molar excess of sodium azide and stirring at room temperature overnight. The polymer was then precipitated from water three times to remove excess azide. To attach the NBD-Aminyne to the polymer each were dissolved in DMF (dried with calcium hydride and alumina) and a copper solubilizing ligand (N,N,N',N",N"-Pentamethyldiethylenetriamine, PMEDTA) was added to the polymer solution, the ratio of fluorophore to polymer was 3:1. Cu(I)Br was added to a third flask inside a glove box and sealed, then the two other solutions were added to this flask by cannula and the reaction was allowed to proceed for two days at 40° C. The resulting polymer (PS-NBD) was precipitated from methanol seven times to remove excess fluorophore as verified by absence of a small molecule fluorescence peak in GPC. By UV/V is, 70% of the polymer chains contain a covalently attached fluorophore by comparison with NBD-alkyne in the same solvent. Fluorophore attachment was verified by a Jasco FP-2020 Plus Intelligent Fluorescence Detector ($\lambda_{excitation}$=465 nm, $\lambda_{emission}$=520 nm, 18 nm bandpass) in line with the GPC system.

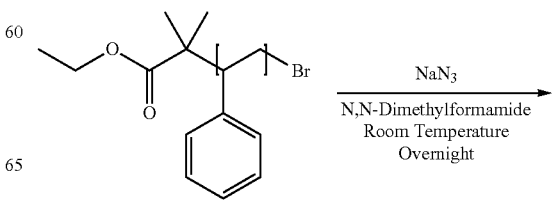

SCHEME 2

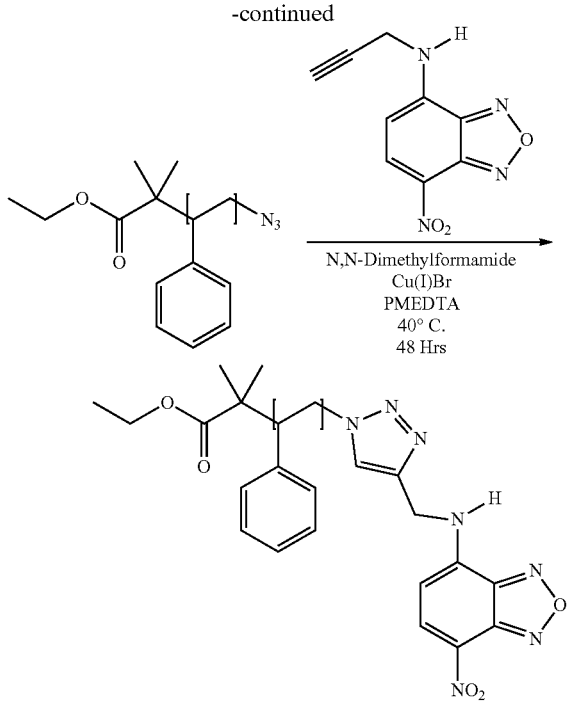

Sample Preparation

Films in this study were spin coated (Specialty Coating Systems Spincoat G3-8) onto glass, quartz or silicon substrates with native oxide layers from solutions of either toluene or cyclopentanone. Glass and quartz substrates were prepared by soaking in a solution of ethanol, deionized water and potassium hydroxide (80/10/10 wt %) and then rinsed with deionized water and tetrahydrofuran at least three times. New silicon substrates with native oxide were prepared by repeated rinsing with isopropyl alcohol and acetone. Solution concentrations ranged from 0.5-6 wt % polymer and spin speeds varied from 800-3000 RPM to control the film thickness. The films were stabilized against dewetting by adding 1 wt % 50,000 g/mol polystyrene (PDI=1.06). After spin coating, films were placed in a vacuum chamber at room temperature overnight. Average thicknesses for samples on glass were measured using a Veeco Dektak 6M Stylus Profiler by recording ten measurements near the center of the film with a stylus force of 7 mg. Films prepared on silicon substrates were characterized by ellipsometry using a J. A. Woollam M-2000D Spectroscopic Ellipsometer.

Topography Creation and Characterization

In order to create the surface energy pattern in the film, the spin coated films were placed on a non-reflecting surface and exposed to light from an Optical Building Blocks ScopeLite 200 (a broadband light source, intensity of 14 W/cm$^2$ at 4 mm from the liquid light guide outlet) through a mask for one minute for samples on glass (total dose=840 J/cm$^2$) or ten seconds for samples on silicon (total dose=140 J/cm$^2$; only features in FIGS. 4A, 4B and 4E were exposed on silicon) at a distance of 4 mm unless otherwise specified. Reduced exposure was appropriate for samples on silicon substrates due to the substrate reflectivity and substrate light absorption. Light intensity was measured using a Radiomter Fieldmax TO (Coherent). Based on IR camera experiments (FLIR), the substrate with the polymer film does not increase in temperature sufficiently to liquify during exposure, even at 10 minute exposure times.

Line masks were Ronchi rulings (Edmond Optics), other mask patterns were from chrome on quartz photomasks (Photronics, Inc.). After exposure, the film was heated to 110° C. for ten minutes on an Instec mK. 1000 temperature controller with a HCS 402 hot stage and the resulting pattern was imaged using an optical microscope. The topography was characterized using the same stylus profiler used to determine film thickness. Color bright field imaging was performed on an Olympus BX 60 microscope with a Spot Insight QE camera. Fluorescence imaging was performed with a Hamamatsu Orca R2 CCD camera with μManager software for camera control on an Olympus BX 51 epifluorescence microscope. For imaging of NBD labeled polymers the excitation wavelength used was 465 nm with a 4 nm bandpass, the emission filter selected for all wavelengths greater than 520 nm.

Other Equipment

Fourier transform infrared (FTIR) spectra were recorded on a Nicolet 6700 FTIR with liquid nitrogen cooled MCT-B detector. Films were solution cast from carbon tetrachloride on a pressed potassium bromide disk. Fluorescence spectroscopy was performed on 0.05 mg/mL polymer solutions in THF on a double-beam Photon Technologies QuantaMaster 40 with a photomultiplier tube detection system with 4 nm excitation slits and 2 nm emission slits. Atomic force microscopy (AFM) was performed using an Agilent 5500 AFM in tapping mode. All AFM images were obtained using antimony-doped silicon tapping mode AFM tips from Veeco with a resonant frequency of 300 kHz and a force constant of 20-80 N/m. X-ray photoelectron spectrometry (XPS) spectra were recorded using a commercial X-ray photoelectron spectrometer (Kratos Axis Ultra), utilizing a monochromatic Al-Ka X-ray source (hv=1486.5 eV), hybrid optics (employing a magnetic and electrostatic lens simultaneously) and a multi-channel plate and delay line detector coupled to a hemispherical analyzer. The photoelectron take-off angle was normal to the surface of the sample and 45° with respect to the X-ray beam. The pressure in the analysis chamber was typically $4 \times 10^{-9}$ Torr during data acquisition. Casa XPS analysis software was used to determine the stoichiometry of the samples from corrected peak areas and employing Kratos sensitivity factors for each element of interest.

Formation of New Fluorophores

Figure 7:
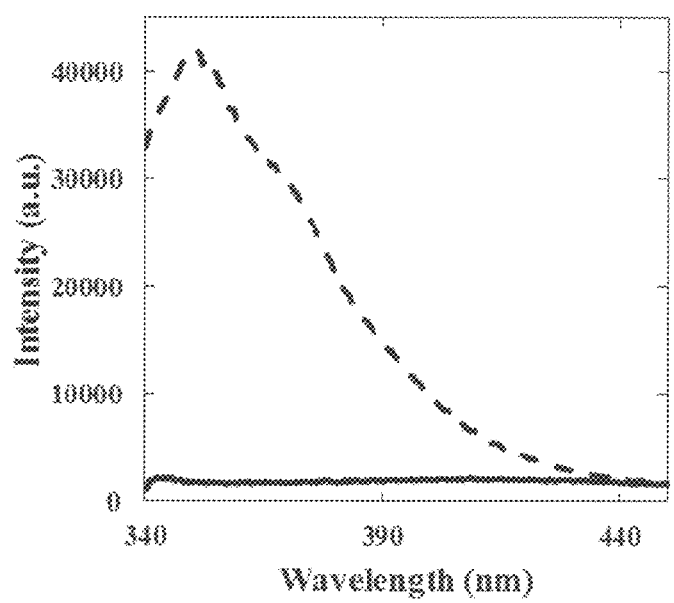
FIG. 7 depicts the results of solution fluorimetry for the detection of stilbene-like fluorescent centers.

Using excitation ($\lambda_{ex}$=310 nm) and emission wavelengths from previously published studies describing details of the effects of UV irradiation of polystyrene, we were able to detect the formation of new fluorophores in UV exposed films. FIG. 7 depicts fluorimetry of neat polystyrene (solid line) and polystyrene exposed for two minutes (broken line) in THF solution. For both samples $\lambda_{ex}$=310 nm. The structure of the fluorophores is stilbene-like, corresponding to dehydrogenation of the polystyrene backbone. This results in the appearance of a new fluorescent peak in the exposed polystyrene that was not present in the initial sample (FIG. 7). Samples for this study were prepared by dissolving exposed and unexposed films in THF. Solution fluorimetry was performed in order to limit excimer formation common in polystyrene films.

Figure 8A:
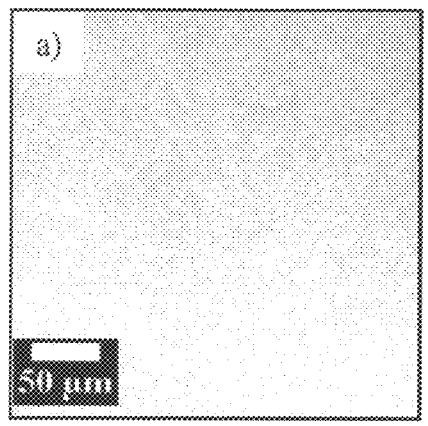
FIGS. 8A-8C depict micrograph images showing the effect of filtering out the light source using a long pass filter.
Figure 8B:
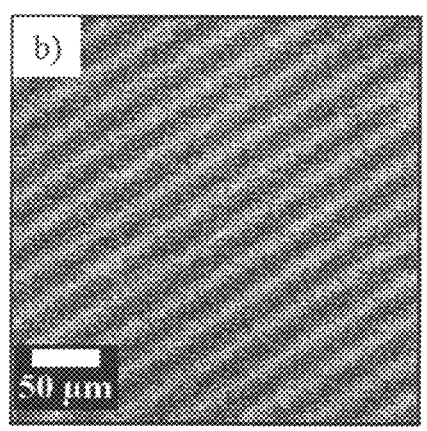
Figure 8C:
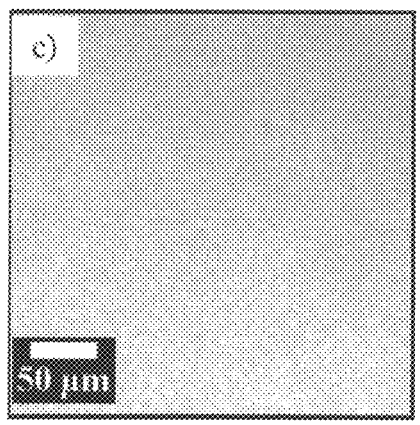

To determine that the cause of feature formation was related to the polystyrene UV photochemistry, fluorophore containing polystyrene was used. A 385 nm long pass filter was placed between the photomask and the light source in order to absorb all of incident UV light that is absorbed by polystyrene while still passing light absorbed by the fluorophore. This long pass filter attenuates the total incident light by 19%, but the total dose is well above the amount necessary for writing the surface energy pattern in absence of the optical filter. FIG. 8 depicts micrographs showing the effect of blocking all wavelengths absorbed by polystyrene using a 385 nm long pass filter during light exposure. FIG. 8A shows a bright field micrograph immediately after exposure. FIG. 8B shows a fluorescence micrograph showing photobleaching of NBD-labeled polystyrene after exposure with the long pass filter in place; light areas indicate high fluorophore concentrations in regions protected by the photo mask. FIG. 8C shows a bright field micrograph of the same region after 1 hour at 110° C. showing no topography. Bright field imaging shows no change in the surface of the film after exposure (See FIG. 8A), but fluorescence imaging shows that wavelengths greater than 385 nm still penetrated the film and photobleached the fluorophore (See FIG. 8B). Finally, upon heating this film for one hour at 110° C. and examining it every 10 minutes by optical microscopy, no features were observed at any time (FIG. 8C). This demonstrates that exposure to UV light which polystyrene absorbs is necessary to induce patterned surface energy which can then later be developed into surface topography.

Estimation of Marangoni Number

Feature formation in PS films results from Marangoni instabilities caused here by a prepatterned surface energy gradient. The critical Marangoni number ($Ma_c$) for the formation of surface instabilities is reported by others as 80. The general form of the Marangoni number is shown in Eqn. 1

$$Ma = -\frac{\Gamma H^2 \nabla C_{PS}}{\mu D} \quad (1)$$

where Ma is the Marangoni number, $\Gamma$ is the surface energy change with composition, $\nabla C_{PS}$ is the gradient in the concentration of PS with position, H is the characteristic length of the surface energy gradient, in this case the half pitch of the photomask, $\mu$ is the viscosity and D is the diffusion coefficient.

In our estimation, we assumed surface energy changes linearly with polymer composition (i.e., between endpoints of neat PS and its fully dehydrogenated form) and that the concentration changes linearly with position which means that $\nabla C_{PS}$ reduces to $\Delta C_{PS}/H$. Using these simplifications, Eqn. 1 can be written as shown in Eqn. 2, the form that will be used for future calculations.

$$Ma = -\frac{\Gamma H^2 (\nabla C_{PS}/H)}{\mu D} = -Ma = -\frac{\Gamma H \Delta C_{PS}}{\mu D} \quad (2)$$

From this point each of the terms can be calculated independently and if $Ma=Ma_c=80$ then $\Delta C_{PS}=\Delta C_{PS}^*$ where $\Delta C_{PS}^*$ is the minimum level of PS dehydrogenation for features to develop.

The Rouse model for unentangled polymer diffusion can be used to estimate the diffusion coefficient for PS at 110° C. using Eqn. 3

$$D = \frac{\rho RT \langle R^2 \rangle}{36 M \mu} \quad (3)$$

where $\rho$ is the density, R is the ideal gas constant, T is the absolute temperature, M is the molecular weight of the polymer and $\langle R^2 \rangle$ is the unperturbed mean-square end-to-end distance of the polymer. For this polymer $\langle R^2 \rangle=(9.12 \times 10^1 \text{ mol}*\text{m}^2/\text{kg})*M,^{16}$ $\rho=988$ kg/m$^3$ at 110° C., T=383.15 K, R=8.3114 kg*m$^2$/s$^2$/mol/K.

In order to approximate F, a group contribution method for calculating surface energy at 298 K is sufficient. First, the cohesive energy density ($e_{coh}$) for PS and fully dehydrogenated PS, which is identical to poly(phenyl acetylene) (PPA) is needed, $e_{coh,PS}=406.4$ J/cm$^3$ and $e_{coh,PPA}=510.8$ J/cm$^3$. Note that the molar volume of PPA was also calculated via a group contribution method, but the molar volume of PS was calculated based on the known mass density. Next, the empirical correlation $\Gamma=0.75$ $e_{coh}^{2/3}$ can be used to calculate the surface energy for each species and $\Gamma_{PS}=41.1$ dyne/cm, $\Gamma_{PPA}=47.9$ dyne/cm. From these results, $\Gamma=-7.12\times10^{-7}$ kg*m$^3$/mol/s$^2$ by dividing the difference in surface energy by the concentration of bulk PS (9486 mol/m$^3$) which would need to be 100% dehydrogenated for realizing the largest change in surface energy.

Combining all of these parameters and using H=5 μm, the half-pitch of the smallest line space pattern, Eqn. 3 can finally be used to calculate $\Delta C_{PS}^*$.

$$80 = -\frac{(-7.12\times10^{-7}\ kg*m^3/mol/s^2)(5.0\times10^{-6}\ m)\Delta C_{PS}*}{7.97\times10^{-14}\ kg*m/s} \quad (4)$$

$$\Delta C_{PS}^* = 1.79\ \text{mol}/m^3 \quad (5)$$

This value of $\Delta C_{PS}^*$ corresponds to a conversion of 0.02% of the bonds in PS converting to PPA. A more conservative estimate would assume the molar volumes of PS and PPA are equal. Recalculating using this approximation gives to $\Gamma_{PPA}$ 41.9 dyne/cm, $\Gamma=-7.48\times10^{-8}$ kg*m$^3$/mol/s$^2$. Using this figure $\Delta C_{PS}^*=17.1$ mol/m$^3$ or 0.18% of bonds being dehydrogenated. Even using this more conservative approach, the experimentally measured conversion of PS units to their dehydrogenated form was at least an order of magnitude above this critical threshold for all samples.

FTIR

Figure 6A:
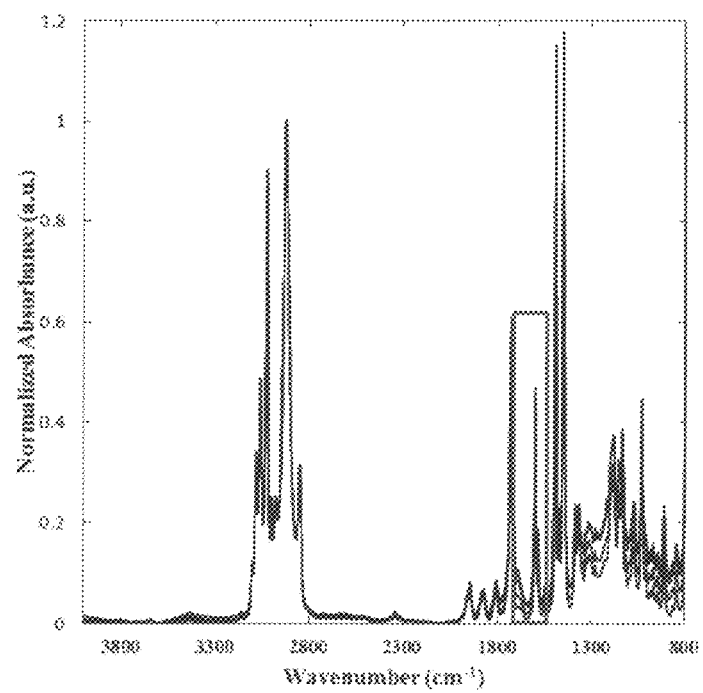
FIGS. 6A and 6B depict FTIR spectra as a function of exposure dose.
Figure 6B:
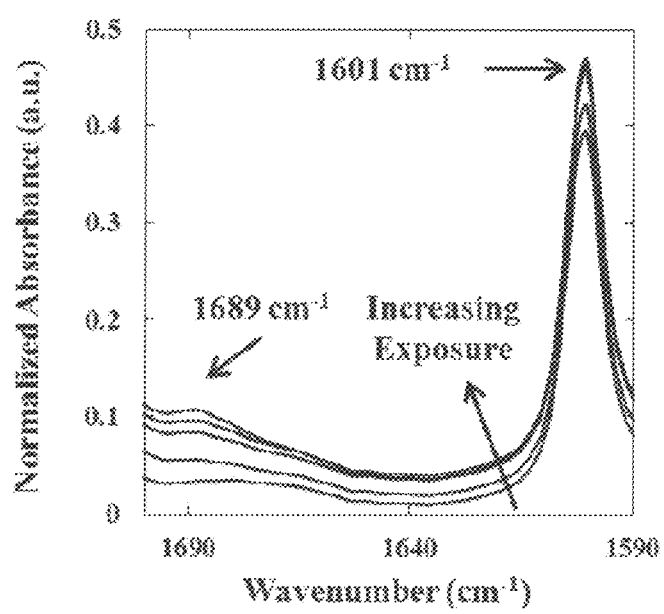

Previous research shows that a common pathway for photo-conversion of polystyrene is dehydrogenation of the backbone to form C=C double bonds along the polymer chain. FIG. 6A contains the complete FTIR spectra collected for polystyrene as a function of UV exposure dose with FIG. 6B showing an expanded region of interest. All spectra are normalized to tallest peak in the phenyl ring region (2926 cm$^{-1}$). The peak at 1601 cm$^{-1}$ in these FTIR spectra is associated with carbon-carbon double bond stretching and has been correlated in this manner by others for characterizing the degradation of polyolefin materials. This region also corresponds to the carbon-carbon stretch in conjugated alkenes, like those that would result from dehydrogenation of the polystyrene backbone. Since conjugated carbon-carbon double bonds in phenyl rings are also present in this peak, it is not straightforward to use this peak for quantitative analysis. Additionally, a second peak appears at 1689 cm$^{-1}$ due to 'alkenyl' C=C stretching which is also not convenient for quantification. Instead, dehydrogenation of the polystyrene backbone can be determined as a function of the exposure dose by tracking the peak from 2800-2964 cm$^{-1}$ corresponding to methylene C—H bond stretching which decreases as alkanes are converted to alkenes in the backbone. By comparing this to the peak corresponding to the carbonyl in the initiator used for polymerization (1720 cm$^{-1}$), which is unaffected by UV exposure, the dehydrogenation of the polystyrene backbone can be quantified. FIG. 5B shows the percent conversion of the polystyrene backbone to its dehydrogenated form as a function of exposure dose.

Control Experiments

Figure 9:
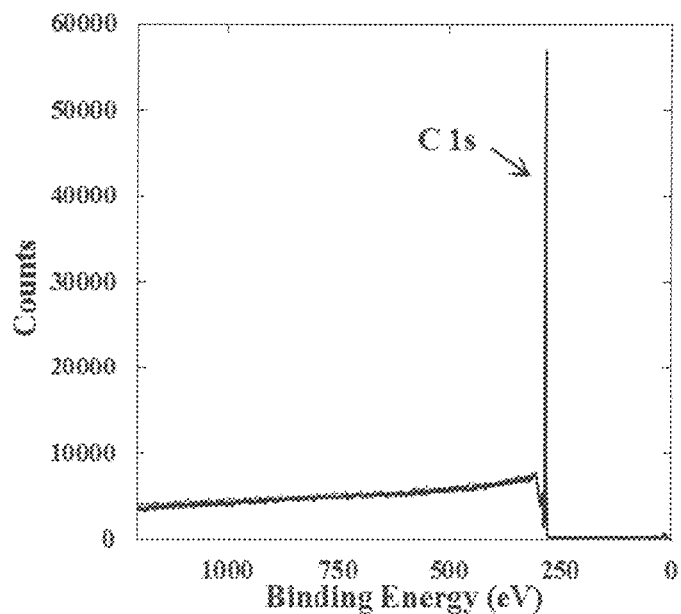
FIG. 9 depicts a surface oxidation study using X-ray photoelectron spectroscopy.

A possible explanation for the increase in local surface energy and the appearance of new chromphores could be oxidation of the surface of the polystyrene film during photo exposure. XPS was performed to determine if oxygen species were present at the surface of the film. FIG. 9 contains the survey scans for both exposed (solid line) and unexposed (dashed line) films of polystyrene. The spectra are identical and this indicates that there was no change in the chemical composition of the surface of the film during exposure, which is consistent with dehydrogenation of the polymer backbone as the predominant chemistry that occurs during photoexposure. XPS was performed on an anionically synthesized sample of polystyrene with similar molecular weight, also verified to undergo Marangoni driven patterning, because there is an oxygen atom in the ATRP initiator which could confound the results of these scans.

Figure 10:
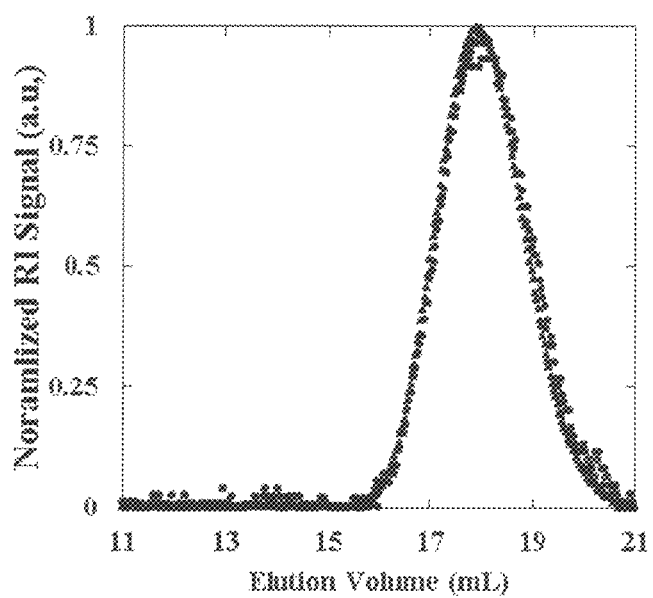
FIG. 10 depicts a gel-permeation study of the light exposed polymer.

Additionally, to confirm that the polymer chains did not undergo cross-linking or other polymer-polymer chain coupling reactions during exposure, the neat polymer and exposed polymer were both characterized by GPC. The chromatograms before and after exposure agree within error. FIG. 10 shows a plot of refractive index vs. time collected by GPC for neat polystyrene (●) and polystyrene exposed to the light source (■).

Figure 11A:
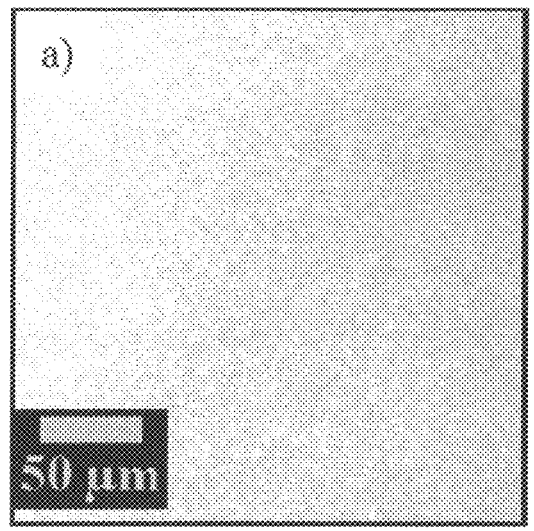
FIGS. 11A-B depict micrograph images showing that the mask has no effect on the formation of indentations in the polymer film.
Figure 11B:
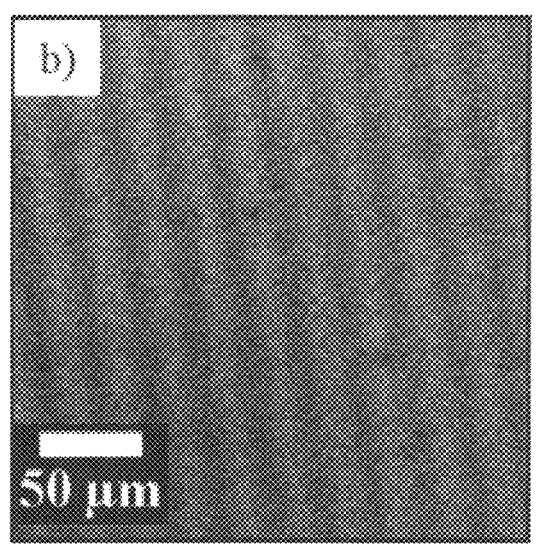

Finally, to verify topography was not caused by the indentation of the photomask in the polystyrene film, several experiments were performed. First, using asymmetric photomasks (such as pyramids as shown in FIG. 4A) and performing profilometry demonstrated that exposed areas rose out of the film and therefore did not propagate into the film promoted from mask indentations. Second, an experiment was performed where films were maintained at −100° C. during UV light exposure only. High-purity argon was passed over the films during this step to limit water condensation on the film surface. At this temperature the polymer film is ~160° C. below its glass transition temperature and solid, rendering indentations arising from mask sink-in unlikely given the polystyrene is deep in the glassy state. FIG. 11A depicts a bright field micrograph of a polystyrene film immediately after UV exposure for 45 seconds at −100° C.; FIG. 11B depicts the same film following 1 hour of heating at 110° C. to develop the topography. Under these exposure conditions features still formed upon heating without the mask present (FIG. 11). Finally, AFM was performed on films after room temperature UV exposure but before heating and no topographical features were detected. These pieces of evidence clearly eliminate mask sink-in as playing any role in this patterning approach.

Overlayer Experiments

Liquid Overlayer

Figure 12A:
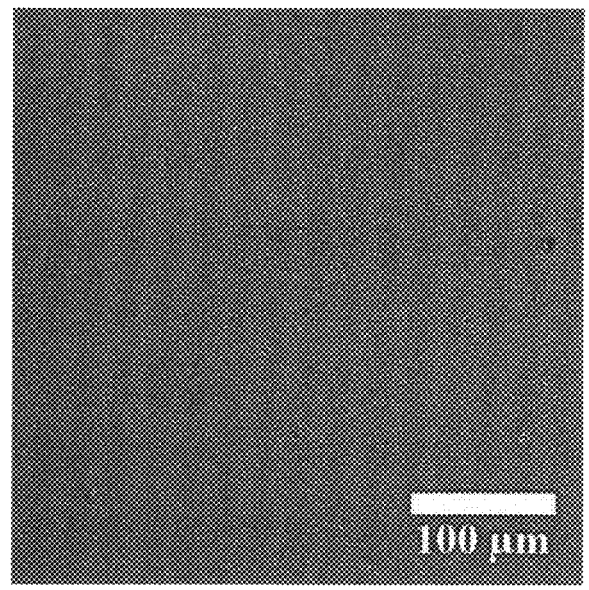
FIGS. 12A-E depict micrographs of a polymer layer having features formed through a liquid overlayer.

Polystyrene film, ~150 nm, was exposed to patterned light (dose 840 J/cm$^2$) through a layer of liquid poly(ethylene glycol) (300 g/mol) placed between the polystyrene film and the photomask. The liquid over-layer was then washed off with deionized water and air dried. The polystyrene film was heated for 10 minutes at 110° C. to develop the topography. FIG. 12A shows that a visible topography was produced on the polystyrene surface.

Figure 12B:
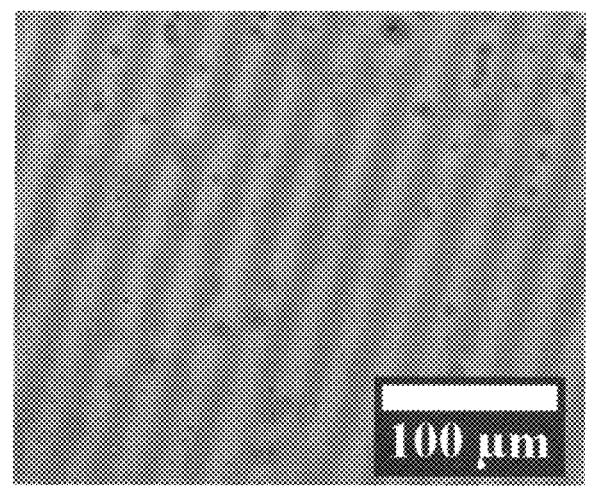

In another experiment, Polystyrene film, ~150 nm, exposed to patterned light (dose 840 J/cm$^2$) through a layer of liquid poly(ethylene glycol) (300 g/mol) placed between the polystyrene film and the photomask. Next, the polystyrene film was heated for 10 minutes at 110° C. with the liquid poly(ethylene glycol) over-layer still in place. FIG. 12B shows that a visible topography was produced on the polystyrene surface in the presence of the liquid overlayer.

Figure 12C:
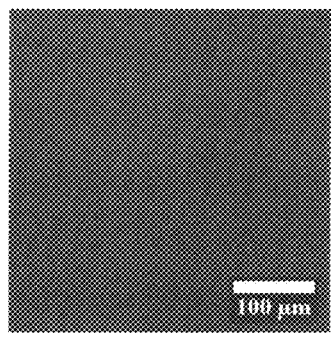

In another experiment, polystyrene film, ~150 nm, exposed to patterned light (dose 840 J/cm$^2$) through a layer of liquid silanol terminated poly(dimethyl siloxane) (3500 cSt) placed between the polystyrene film and the photomask. Next, the polystyrene film was heated for 10 minutes at 110° C. with the silanol terminated poly(dimethyl siloxane) liquid over-layer still in place. FIG. 12C shows that a visible topography was produced on the polystyrene surface in the presence of the liquid over-layer.

Figure 12D:
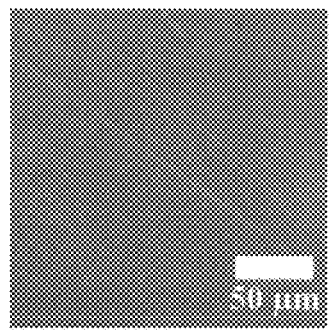
Figure 12E:
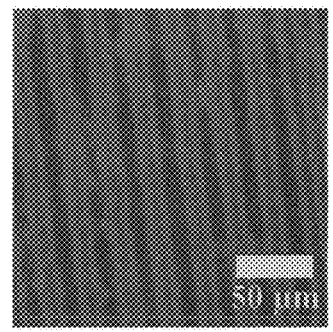

In another embodiment, a ~150 nm film of polystyrene was spin coated onto a substrate and a 89 nm film of poly(methyl methacrylate) (18 kg/mol) was placed on top of the polystyrene film by floating to make a bilayer polymer film. The layered film was then exposed to patterned light (dose 840 J/cm$^2$), FIG. 12D, which did not introduce topography. The bilayer film was then heated for 10 minutes at 140° C. FIG. 12E shows that a visible topography was produced on the polystyrene surface in the presence of the poly(methyl methacrylate) over-layer and significant topography was visible.

Sputter Coating

Figure 13A:
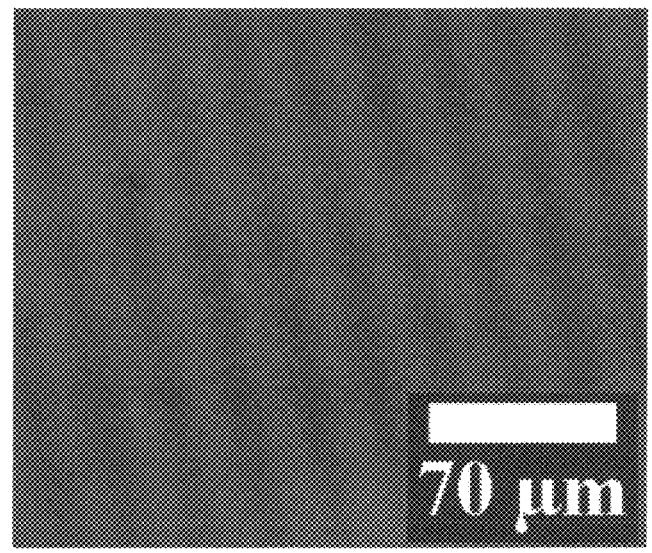
FIGS. 13A-B depict micrographs of a polymer layer having features formed through a metal overlayer.

A polystyrene film, ~150 nm, with 52 nm of gold sputter coated on top of the polystyrene film was exposed to patterned light (dose 840 J/cm$^2$) through the solid gold over-layer. Next, the film was heated for 10 minutes at 110° C. with the solid gold over-layer still in place. FIG. 13A shows that a visible topography was produced on the polystyrene surface in the presence of the gold over-layer.

Figure 13B:
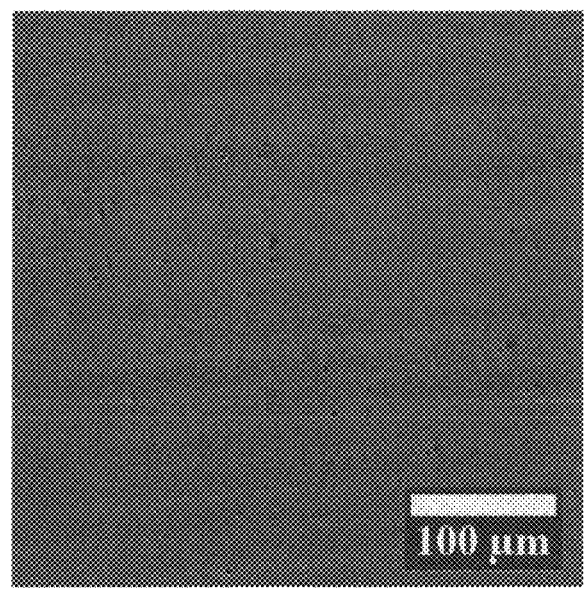

In another experiment, polystyrene film, ~150 nm, was exposed to patterned light (dose 840 J/cm$^2$) and then a 52 nm coating of gold was sputter deposited on top of the polystyrene film. Next the polystyrene film was heated for 10 minutes at 110° C. with the solid gold overlayer still in place. FIG. 13B shows that a visible topography was produced on the polystyrene surface in the presence of the gold overlayer.

Other Demonstrations

Figure 22:
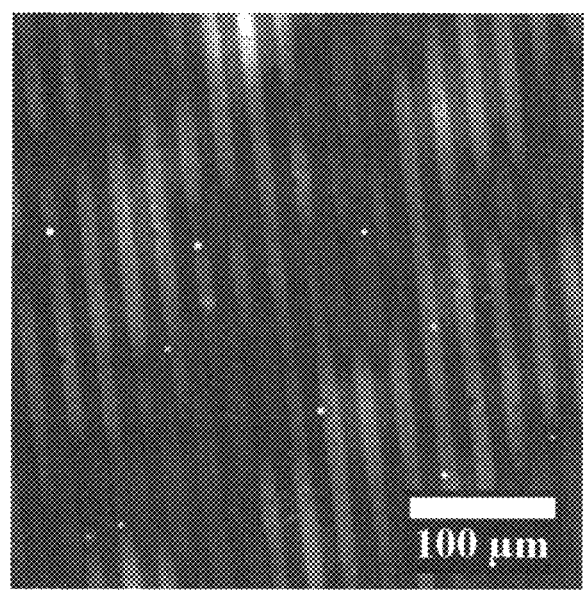
FIG. 22 depicts a micrograph of a poly(para-trimethylsilylstyrene) patterned film.

In another embodiment, a film of poly(para-trimethylsilylstyrene), 96 nm, was formed on a silicon wafer and exposed to light (dose 140 J/cm$^2$) and subsequently heated to 140° C. A topography formed in the poly(para-trimethylsilylstyrene). (FIG. 22).

In another experiment, 8,000 g/mol PS was exposed to patterned light (dose 840 J/cm$^2$) and heated for three hours at 110° C. and topography developed. This demonstrates that higher molecular weight polymers can also be used for this process. See FIG. 27.

Photosensitization

Figure 14A:
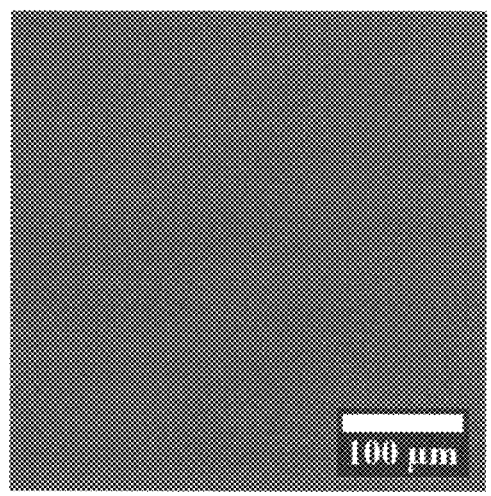
FIGS. 14A-B depict micrographs of a neat PMMA after being exposed to light.
Figure 14B:
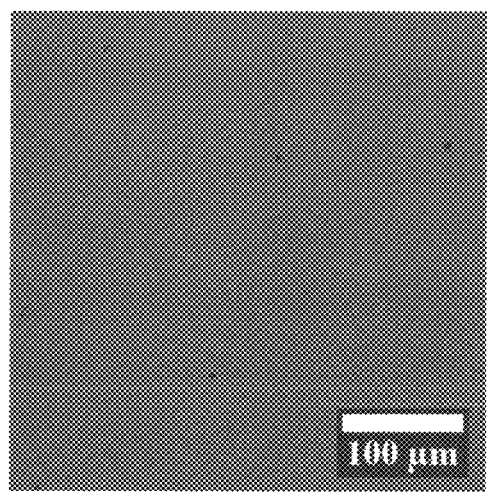

In some instances, the polymers may not be reactive enough in the wavelengths of light used to develop the pattern. In an embodiment, a photosensitizer may be added to the polymer to assist in forming the surface energy pattern and subsequent topography formation. Neat poly(methyl methacrylate) ("PMMA"), ~150 nm, was exposed to patterned light (dose 840 J/cm$^2$). The PMMA film was then heated to 110° C. for 10 minutes. No topography was formed in the film (FIG. 14A). The exposed PMMA film at 140° C. for an additional 10 minutes (the glass transition temperature of PMMA is 89° C.). No topography was formed in the film after the additional heating (FIG. 14B).

Figure 15:
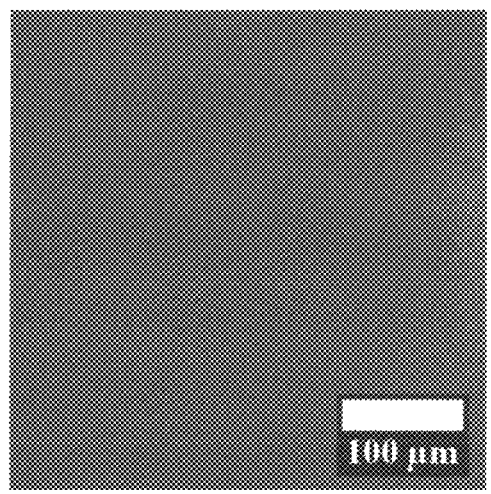
FIGS. 15, 16 depict micrographs of PMMA having pyrene as a photosensitizer after being exposed to light.
Figure 16:
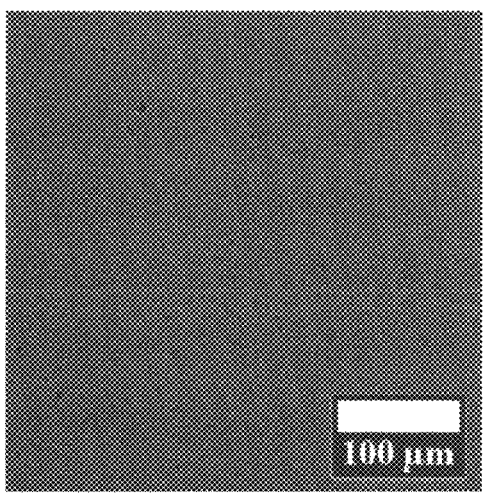

A PMMA film that included 10 wt % pyrene (a photosensitizer), ~150 nm, was exposed to patterned light (dose 840 J/cm²) after one hour under vacuum. Immediately after exposure no topography could be detected (FIG. 15). The exposed film was then heated at 110° C. for 10 minutes. FIG. 16 shows that a visible topography was produced on the PMMA. Two identically prepared PMMA films with 10 wt % pyrene, ~150 nm, were place under vacuum for one hour. After this time, one of the films was exposed to light (dose 840 J/cm²) without a photo mask. These two films were then dissolved in tetrahydrofuran and gel permeation chromatography was performed. In-line fluorimetery traces from both samples were performed. The fluorimeter was set to detect pyrene fluorescence $\lambda_{ex}$=340, $\lambda_{em}$=394). The unexposed sample only contained pyrene at an elution volume for small molecules (21 mL and larger) while the exposed sample (green) exhibited a new peak at a retention volume of 15 mL corresponding to pyrene being covalently bound to the polymer chain. It is believed that this is a contributor to the origin of sensitizing PMMA using pyrene small molecule additives for Maragoni driven topography formation.

Figure 17:
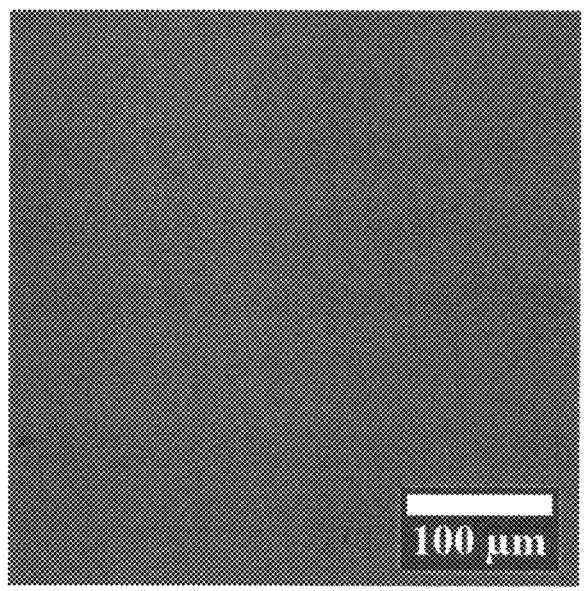
FIG. 17 depicts a micrograph of PMMA having anthracene as a photosensitizer after being exposed to light.

In another experiment, PMMA with 10 wt % anthracene film, ~150 nm, was exposed to patterned light (dose 840 J/cm²). After three hours under vacuum, the film was then heated at 110° C. for 10 minutes. FIG. 17 shows that a topography developed in the film. This experiment shows that other molecules that significantly absorb light in appropriate wavelength ranges can be used. While we have thus far only demonstrated this method with pyrene and anthracene, it is believed that may other photoactive small molecules can be used as a photosensitizer.

Figure 18A:
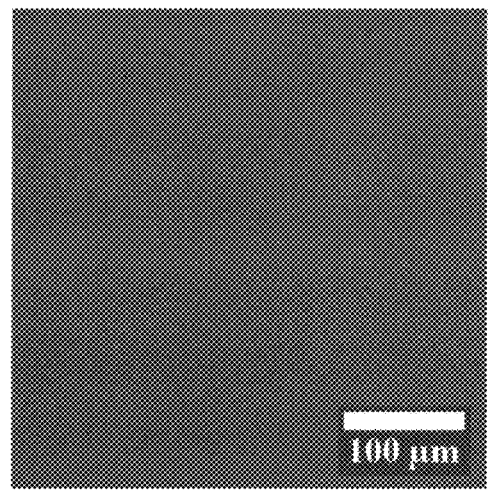
FIGS. 18A-B depict micrographs of DPE PMMA after being exposed to light.
Figure 18B:
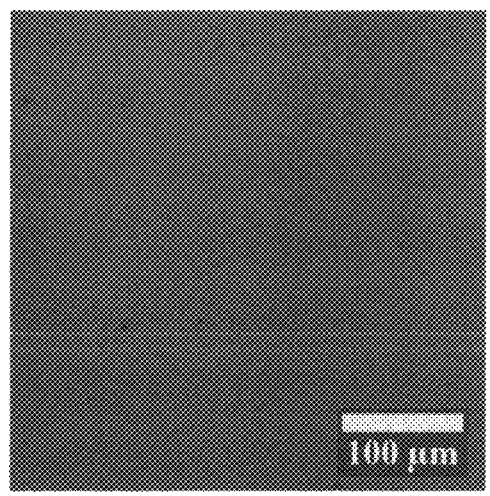

In the previous examples, a photosensitizer (e.g., pyrene or anthracene) were mixed with a polymer film (PMMA) to activate the inactive polymer to the topography formation technique. In an alternate method, a photosensitizer may be attached to a polymeric material, as opposed to being mixed with or doped into a film. Neat Diphenylethylene-PMMA ("DPE PMMA"), ~150 nm, was exposed to patterned light (dose 840 J/cm²). Immediately after exposure no topography could be detected (FIG. 18A). The DPE PMMA film was then heated to 110° C. for 10 minutes and no topography was formed. The DPE PMMA film was subsequently heated at 140° C., which is above its glass transition temperature of 96° C., for an additional 10 minutes. A slight topography was evident (FIG. 18B). Diphenylethylene is a light absorbing part of the initiator fragment used to synthesize this polymer not present in PMMA synthesized via other techniques. The light absorbing moiety (DPE) is purposefully attached to the polymer chain during synthesis, as opposed to mixed or doped into the film. This technique may be modified by making a copolymer from an inactive monomer with a light absorbing monomer.

Figure 19A:
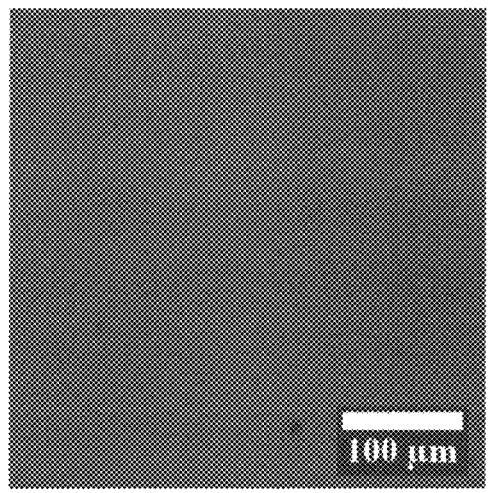
FIGS. 19A-B depict micrographs of a neat PiBMA after being exposed to light.
Figure 19B:
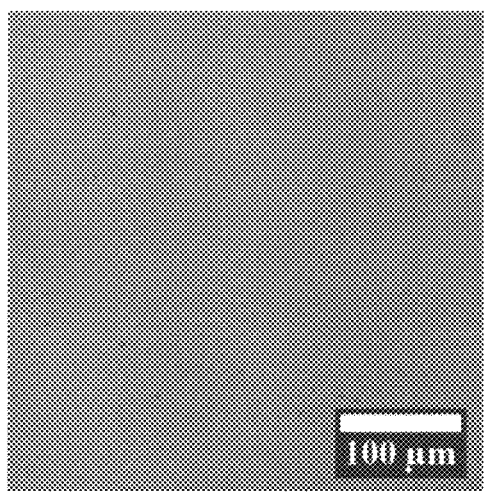
Figure 20A:
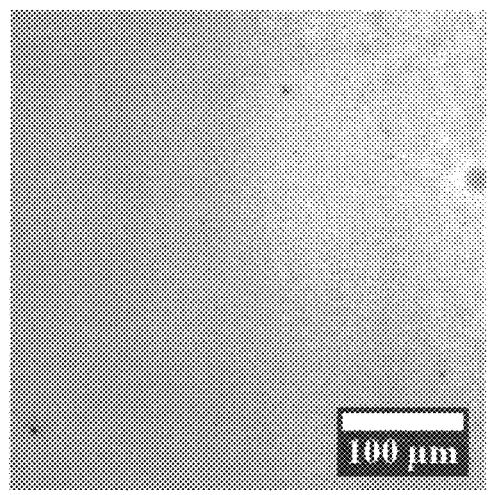
FIGS. 20A-B depict micrographs of PiBMA having pyrene as a photosensitizer after being exposed to light.
Figure 20B:
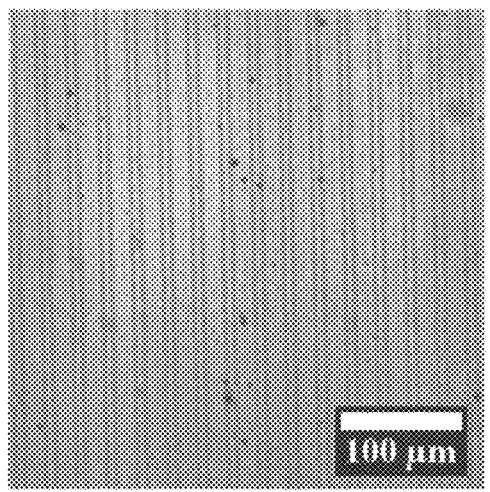

In another example, neat poly (isobutyl methacrylate) ("PiBMA"), ~150 nm, was exposed to patterned light (dose 840 J/cm²). Immediately after exposure no topography could be detected (FIG. 19A). The PiBMA film was then heated to 110° C. for 10 minutes and no topography was formed (FIG. 19B). No light absorbing species was present (either attached to the PiBMA or mixed/doped in). PiBMA with 10 wt % pyrene doped into the film, ~150 nm, was exposed to patterned light (dose 840 J/cm²) after three hours under vacuum. Due to the low glass transition temperature of this polymer (52° C.), the film was cooled to 15° C. during exposure to prevent the photomask from causing indentations in the film. Immediately after 5 exposure no topography could be detected (FIG. 20A). The PiBMA film was then heated at 110° C. for 10 minutes and a topography developed (FIG. 20B).

Cycling the Film

Figure 21A:
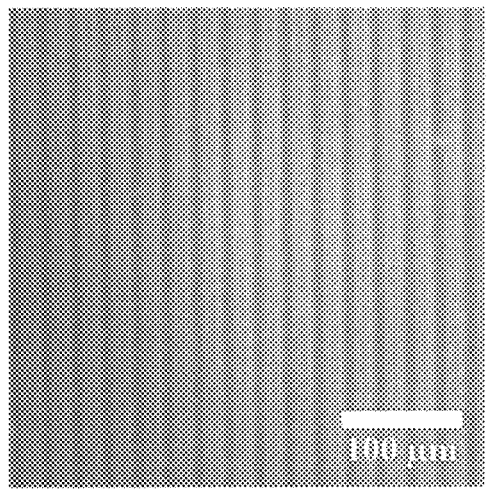
FIGS. 21A-F depict micrographs of a polystyrene film being cycled between a patterned 5 state and an unpatterned state.
Figure 21B:
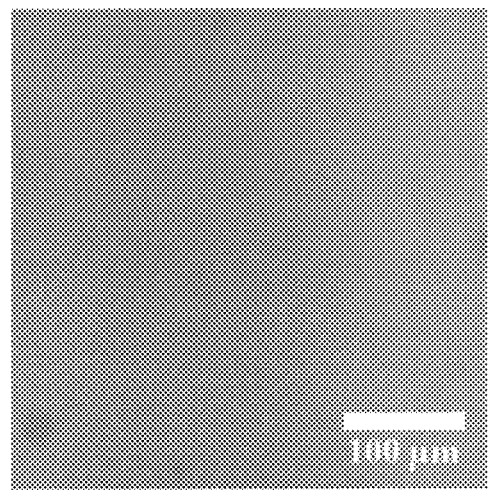
Figure 21D:
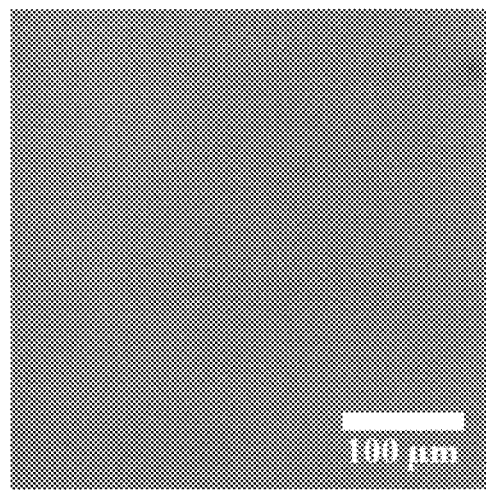
Figure 21C:
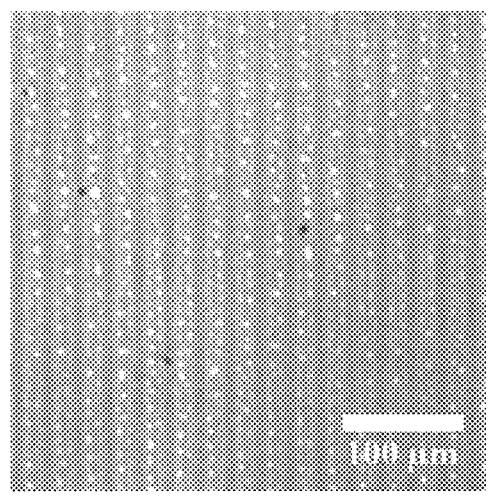
Figure 21E:
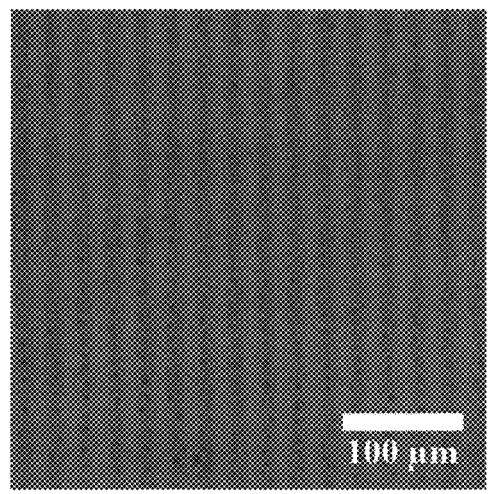
Figure 21F:
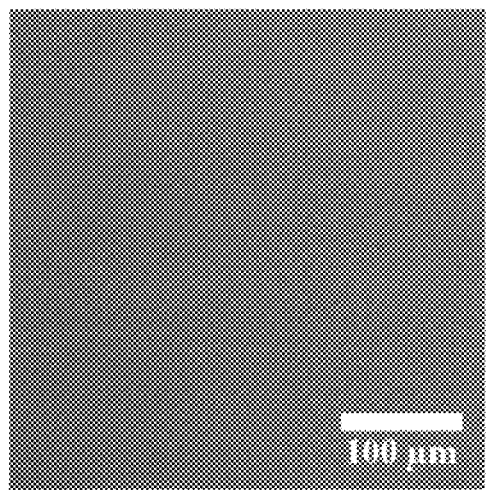

A polystyrene film, ~150 nm, was exposed to patterned light (dose 840 J/cm²). The film was then heated at 110° C. for 30 minutes in order to allow a topography to develop (FIG. 21A). After this, the film was heated at 140° C. for several hours and the topography dissipated (FIG. 21B). Once the topography was no longer detectable, the process was repeated twice more and the topography reformed each time (FIG. 21C, FIG. 21E), although the maximum feature height decreased with each successive cycle. The topography dissipated during each extended heating periods (FIG. 21D, FIG. 21F). In all cycles, the sample was exposed to patterned light in the solid state, then the topography was formed by heating to the liquid state. The features were also dissipated in the liquid state, but at higher temperature where viscosity is lower to accelerate the process.

Cyclic Summary:
  Initial film thickness: 285 nm
  Previously Established Time To Max in Peak on 1st Develop: 30 mins
  Expected first heat feature height from identical films: 105 nm
  Heating Temperature During Develop: 110° C.
  Decay Temperature: 140° C.
  Feature height measurements are peak to valley height. Note these are not light exposure times, but the heating times either during Development or Decay.

| Cycle | Time (mins) | Feature Height |
|---|---|---|
| 1st Develop | 30 | No Data |
| 1st Decay | 180 | 0 nm (no features) |
| 2nd Develop | 30 | 70.3 |
| 2nd Decay | 120 | 0 nm (no features) |
| 3rd Develop | 30 | 56.6 nm |
| 3rd Decay | 120 | 0 nm (no features) |

Other Shapes

Figure 23A:
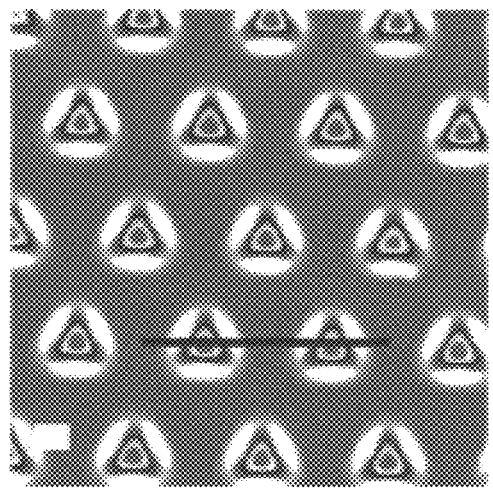
FIG. 23A depicts a micrograph of a polystyrene film exposed to light through a photomask at the desired feature locations.
Figure 23B:
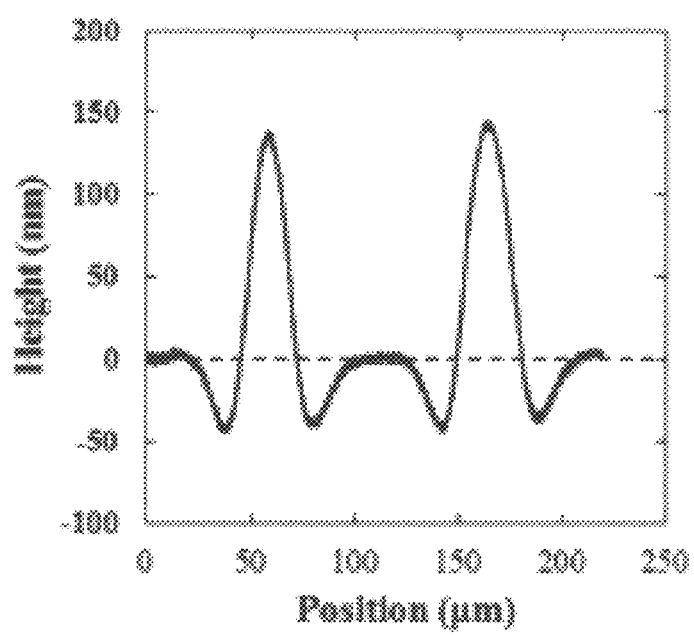
FIG. 23B depicts a profilometry graph of the segment indicated in FIG. 23A.

A polystyrene film on a silicon wafer, ~150, nm was exposed to patterned light (140 J/cm²) through a photomask exposed only the desired features. This causes the features (FIG. 23A) to rise out of the film, due to their higher surface energy, upon thermal development (10 minutes at 110° C.). Profilometry (FIG. 23B) shows two subsequent pillars as well as the depletion zone next to them that is the source of the material for the features. The scan path is approximately along the line in FIG. 23A.

Figure 24A:
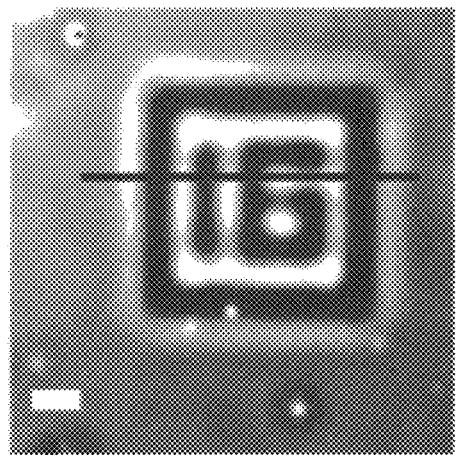
FIG. 24A depicts a micrograph of a polystyrene film exposed to light through a photomask with the desired feature locations hidden from the light by the mask.
Figure 24B:
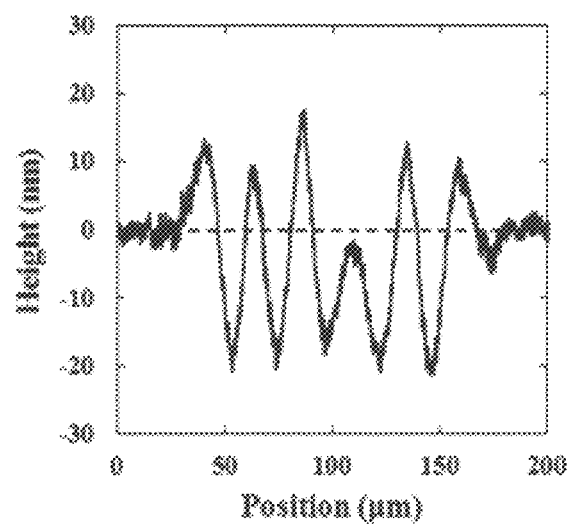
FIG. 24B depicts a profilometry graph of the segment indicated in FIG. 24A.
Figure 24C:
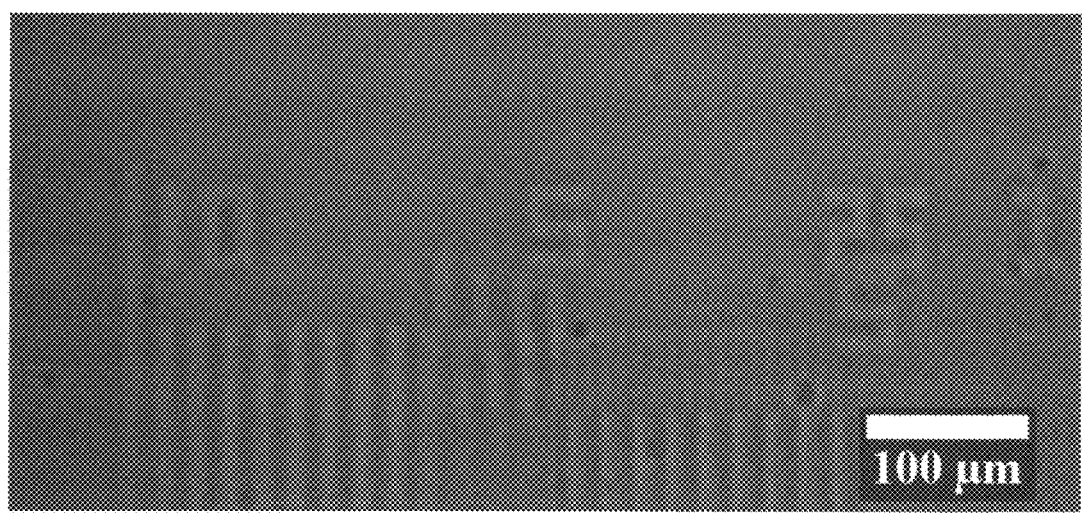
FIG. 24C depicts a micrograph of a polystyrene film exposed to light through a photomask having alternate features.

A polystyrene film on a silicon substrate, ~150 nm was exposed to patterned light (140 J/cm²) through a photomask that had chrome patterned features on a mostly clear quartz mask, leaving only the desired features protected from light. This causes the features (FIG. 24A) to sink into the film, due to their low surface energy, upon thermal development (10 minutes at 110° C.) as evidenced by profilometry (FIG. 24B). The scan path is approximately along the line in FIG. 24A. Another example of a topography formed using a complex patterned mask is shown in FIG. 24C.

Pattern Transfer

Figure 25B:
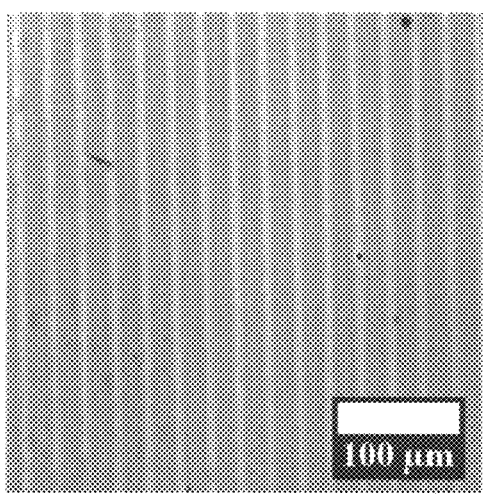

Sylgard 184 was poured over a polystyrene film that already had topographic features developed in it (FIG. 25A) in order to demonstrate the ability to transfer the pattern into a material commonly used for soft lithographic applications. The Sylgard was cured at room temperature for 24 hours and then heated to 100° C. for two hours to completely cure it. The copy was then removed and a mirror of the topography from the original was present in the elastomeric material (FIG. 25B).

In another embodiment, Poly(t-butoxycarbonyloxy styrene), Poly(t-BOC-S), (Mn=9.1 kg/mol, PDI=1.01) was synthesized by atom transfer radical polymerization. The $T_g$ was determined to be 148.94° C. (midpoint by DSC). FTIR, feature development with base, and water contact angle experiments were performed to verify that the synthesized poly(t-BOC-S) behaves as a photoresist as reported in the literature. The photo-acid generator (P AG) used for this study was triphenyl sulfonium triflate (TPS), which is known to be activated with 233 nm wavelength light. A solution including the synthesized polymer, PAG, and quencher (tri-octyl amine) was prepared and spincoated. The quencher was applied to impede the diffusion of acid produced from the patterned light exposure. The film with PAG and quencher additives was spin-coated from cyclohexanone to produce a film thickness in the range of 700 nm to 1 μm. Light exposures were performed with a 200 W metal-halide lamp with broadband output from ~200-600 nm coupled with 254 nm bandpass filter (40 nm FWHM) through a 25 μm-pitch line and space photomask (ronchi ruling) with typical dose amount of 53 mJ/cm$^2$. In the light exposed regions, the poly(t-BOC-S) polymer is transformed to the higher surface energy poly(hydroxystryrene), by cleaving the t-BOC group with the acid generated from the PAG, which activates the Marangoni flow patterning process when the film is in the liquid state during thermal annealing.

Figure 28A:
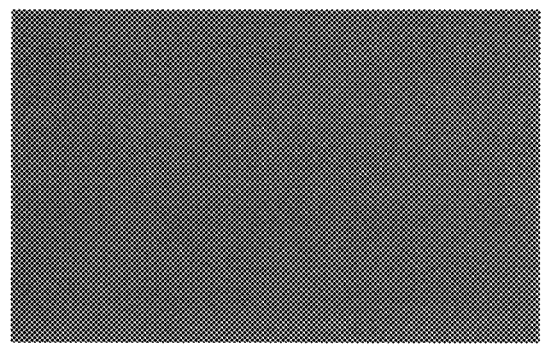
FIGS. 28A-C depict micrographs of Poly(t-BOC-S) before exposure, after exposure, and after subsequent thermal anneal, respectively.
Figure 28B:
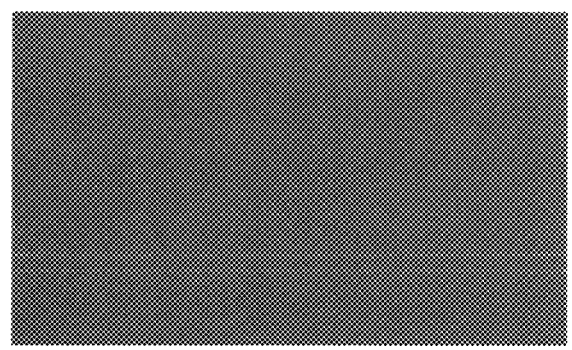
Figure 28C:
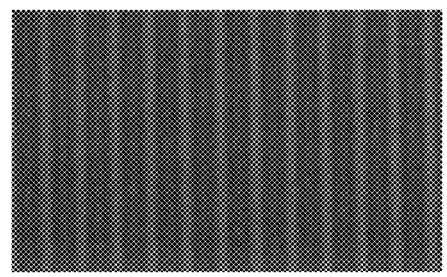
Figure 28D:
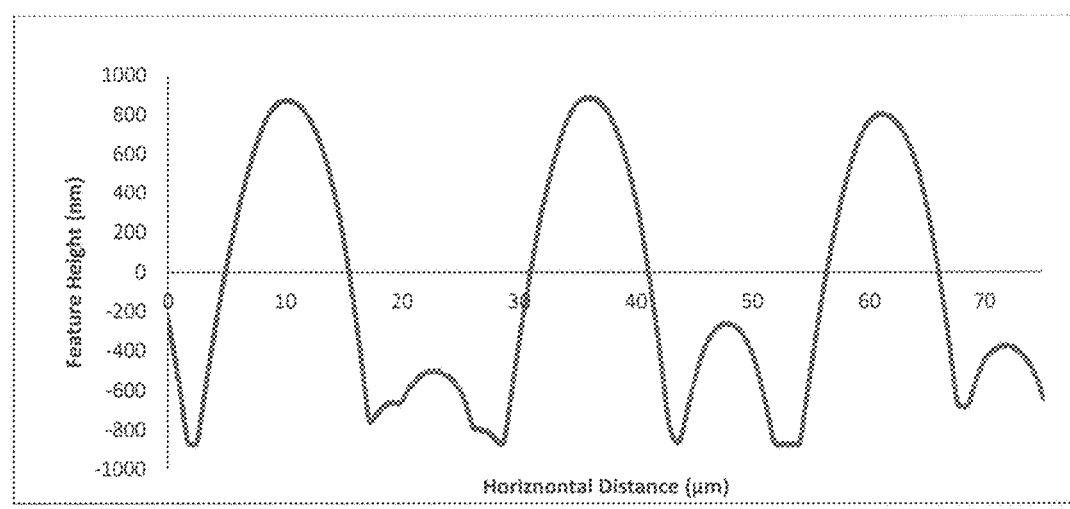
FIG. 28D depicts a graph of the topography of the film surface of FIG. 28C after patterned light exposure and subsequent thermal annealing.

Optical microscope pictures of before exposure, after exposure, and after subsequent thermal annealing at 180° C. for 3 minutes are given as FIGS. 28A, 28B, and 28C, respectively. Profilometry of the patterned topographical features after annealing is given as FIG. 28D. This system yields almost 2 micrometer size features with a small exposure dose and short annealing time (the entire process including exposure and annealing is 3 minutes 5 seconds). In FIG. 28B, a slight color change between exposed and unexposed regions was observed by optical microscopy after patterned light exposure, but topographical features were not detectable by profilometry because the feature height is relatively small (i.e., less than a few nanometers).

In this patent, certain U.S. patents, U.S. patent applications, and other materials (e.g., articles) have been incorporated by reference. The text of such U.S. patents, U.S. patent applications, and other materials is, however, only incorporated by reference to the extent that no conflict exists between such text and the other statements and drawings set forth herein. In the event of such conflict, then any such conflicting text in such incorporated by reference U.S. patents, U.S. patent applications, and other materials is specifically not incorporated by reference in this patent.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method of forming a topographical pattern in a polymer substrate, comprising:
   exposing the polymer substrate in its solid state to a pattern of activating light for a time sufficient to cause at least a portion of the polymer substrate exposed to the light to undergo a change in surface energy; and
   heating the polymer substrate to a temperature sufficient to liquefy the polymer substrate after exposure to activating light, wherein the temperature is selected such that the polymer substrate adopts a topography that corresponds to the pattern of activating light.

2. The method of claim 1, further comprising cooling the liquefied polymer substrate to solidify the polymer substrate.

3. The method of claim 1, further comprising solidifying the liquefied polymer substrate by crosslinking the polymer substrate.

4. The method of claim 1, wherein the polymer substrate is a thin film deposited on a substrate.

5. The method of claim 1, wherein the pattern of activating light is formed by shining light through a mask that is proximate to the polymer substrate.

6. The method of claim 5, wherein the mask is removed from the proximity of the polymer substrate prior to heating the polymer substrate.

7. The method of claim 1, further comprising forming a liquid layer on a surface of the polymer substrate prior to exposing the polymer substrate to the pattern of activating light.

8. The method of claim 7, wherein the liquid layer is removed from the surface after the polymer substrate is exposed to the pattern of activating light.

9. The method of claim 7, wherein the liquid layer remains on the surface when the polymer substrate is heated to liquefy the polymer substrate.

10. The method of claim 1, further comprising depositing a metal layer or other inorganic or vapor deposited compounds on a surface of the polymer substrate prior to exposing the polymer substrate to the pattern of activating light.

11. The method of claim 1, further comprising depositing a metal layer or other inorganic or vapor deposited compounds on the surface of the activating light exposed polymer substrate prior to heating the polymer substrate to liquefy the polymer substrate.

12. The method of claim 1, further comprising depositing a second polymeric layer on a surface of the polymer substrate prior to exposing the polymer substrate to the pattern of activating light.

13. The method of claim 1, wherein the polymer substrate comprises a mixture of a polymer and one or more photosensitizers.

14. The method of claim 1, wherein the polymer substrate comprises a polymer coupled to one or more photosensitizers.

15. The method of claim 2, further comprising heating the cooled polymer substrate to liquefy the polymer at a temperature and time sufficient to remove at least a portion of the pattern.

16. The method of claim 1, wherein the activating light is UV light.

17. The method of claim 1, wherein the activating light is actinic light, visible light, or infrared light.

18. The method of claim 1, wherein the polymer substrate comprises polystyrene.

19. The method of claim 1, wherein the polymer substrate comprises poly(para-trimethylsilylstyrene), poly(methyl methacrylate), poly(isobutyl methacrylate), or poly(t-butoxycarbonyloxy styrene).

20. A method of transferring a topographical pattern from a patterned substrate, comprising:
  contacting the patterned substrate with a liquid lithography mask material, and curing the material,
  wherein the patterned substrate is a topographical patterned polymer substrate prepared by
  exposing a polymer substrate in its solid state to a pattern of activating light for a time sufficient to cause at least a portion of the polymer substrate exposed to the light to undergo a change in surface energy; and
  heating the polymer substrate to a temperature sufficient to liquefy the polymer substrate after exposure to activating light, wherein the temperature is selected such that the polymer substrate adopts a topography that corresponds to the pattern of activating light.

* * * * *